(12) United States Patent
Wang et al.

(10) Patent No.: US 11,482,535 B2
(45) Date of Patent: Oct. 25, 2022

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Qiguang Wang, Wuhan (CN); Wenxi Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 107 days.

(21) Appl. No.: 16/863,125

(22) Filed: Apr. 30, 2020

(65) Prior Publication Data

US 2020/0411545 A1 Dec. 31, 2020

Related U.S. Application Data

(60) Provisional application No. 62/942,731, filed on Dec. 2, 2019.

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC .............. H01L 27/11578; H01L 27/11582
See application file for complete search history.

(56) References Cited

U.S. PATENT DOCUMENTS

| 10,700,089 B1 | 6/2020 | Hojo et al. |
| 10,854,513 B2 | 12/2020 | Kawasaki et al. |
| 10,985,176 B2 | 4/2021 | Iwai et al. |
| 2010/0019310 A1* | 1/2010 | Sakamoto ............ H01L 29/792 257/324 |
| 2013/0137229 A1 | 5/2013 | Goda |
| 2017/0062330 A1 | 3/2017 | Kim et al. |
| 2019/0081067 A1 | 3/2019 | Eom et al. |
| 2020/0227318 A1 | 7/2020 | Kawasaki et al. |

FOREIGN PATENT DOCUMENTS

| CN | 106057636 A | 10/2016 |
| CN | 106920798 B | 6/2018 |
| CN | 109742082 A | 5/2019 |

\* cited by examiner

*Primary Examiner* — Christopher A Johnson
(74) *Attorney, Agent, or Firm* — Bayes PLLC

(57) ABSTRACT

Embodiments of structure and methods for forming a three-dimensional (3D) memory device are provided. In an example, the memory device includes a stack structure having interleaved a plurality of sacrificial layers and a plurality of dielectric layers over a substrate along a vertical direction. The memory device also includes a channel structure extending in the stack structure along the vertical direction. A thickness of at least one of the plurality of sacrificial layers is nominally proportional to a width of the channel structure at the same depth. A thickness of at least one of the plurality of dielectric layers is nominally inversely proportional to a width of the channel structure at the same depth.

20 Claims, 29 Drawing Sheets

THREE-DIMENSIONAL MEMORY DEVICES AND METHODS FOR FORMING THE SAME

CROSS-REFERENCE TO RELATED APPLICATIONS

This application claims the benefit of priority to Chinese Patent Applications No. 201910571659.5, filed on Jun. 28, 2019, and to U.S. Provisional Application No. 62/942,731, filed on Dec. 2, 2019, both of which are incorporated herein by reference in their entireties. This application is also related to U.S. application Ser. No. 16/863,048, filed on Apr. 30, 2020, entitled "THREE-DIMENSIONAL MEMORY DEVICES AND METHODS FOR FORMING THE SAME," and U.S. application Ser. No. 16/863,080, filed on Apr. 30, 2020, entitled "THREE-DIMENSIONAL MEMORY DEVICES AND METHODS FOR FORMING THE SAME," all of which are hereby incorporated by reference in their entireties.

BACKGROUND

Embodiments of the present disclosure relate to contact structures having conductive portions in substrate in three-dimensional (3D) memory devices, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, the memory device includes a stack structure having interleaved a plurality of conductor layers and a plurality of dielectric layers over a substrate along a vertical direction. The memory device also includes a channel structure extending in the stack structure along the vertical direction. A thickness of at least one of the plurality of conductor layers is nominally proportional to a width of the channel structure at a same depth. A thickness of at least one of the plurality of dielectric layers is nominally inversely proportional to a width of the channel structure at a same depth.

In another example, the memory device includes a stack structure having interleaved a plurality of conductor layers and a plurality of dielectric layers over a substrate along a vertical direction. The memory device also includes a channel structure extending in the stack structure and divided into a plurality of portions along the vertical direction. Thicknesses of conductor layers corresponding to each of the plurality of portions are nominally proportional to a width of the channel structure in the respective portion. Thicknesses of dielectric layers corresponding to each of the plurality of portions are nominally inversely proportional to a width of the channel structure in the respective portion.

In a further example, the method includes the following operations. A dielectric stack is formed over a substrate. The dielectric stack includes interleaved a plurality of sacrificial layers and dielectric layers along a vertical direction. A thickness of at least one of the plurality of sacrificial layers is different from thicknesses of other sacrificial layers. A thickness of at least one of the plurality of dielectric layers is different from thicknesses of other dielectric layers. A channel structure is formed in the dielectric stack such that a width of the channel structure is nominally proportional to the at least one of the plurality of sacrificial layers and nominally inversely proportional to the at least one of the plurality of dielectric layers. The plurality of sacrificial layers are replaced with a plurality of conductor layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
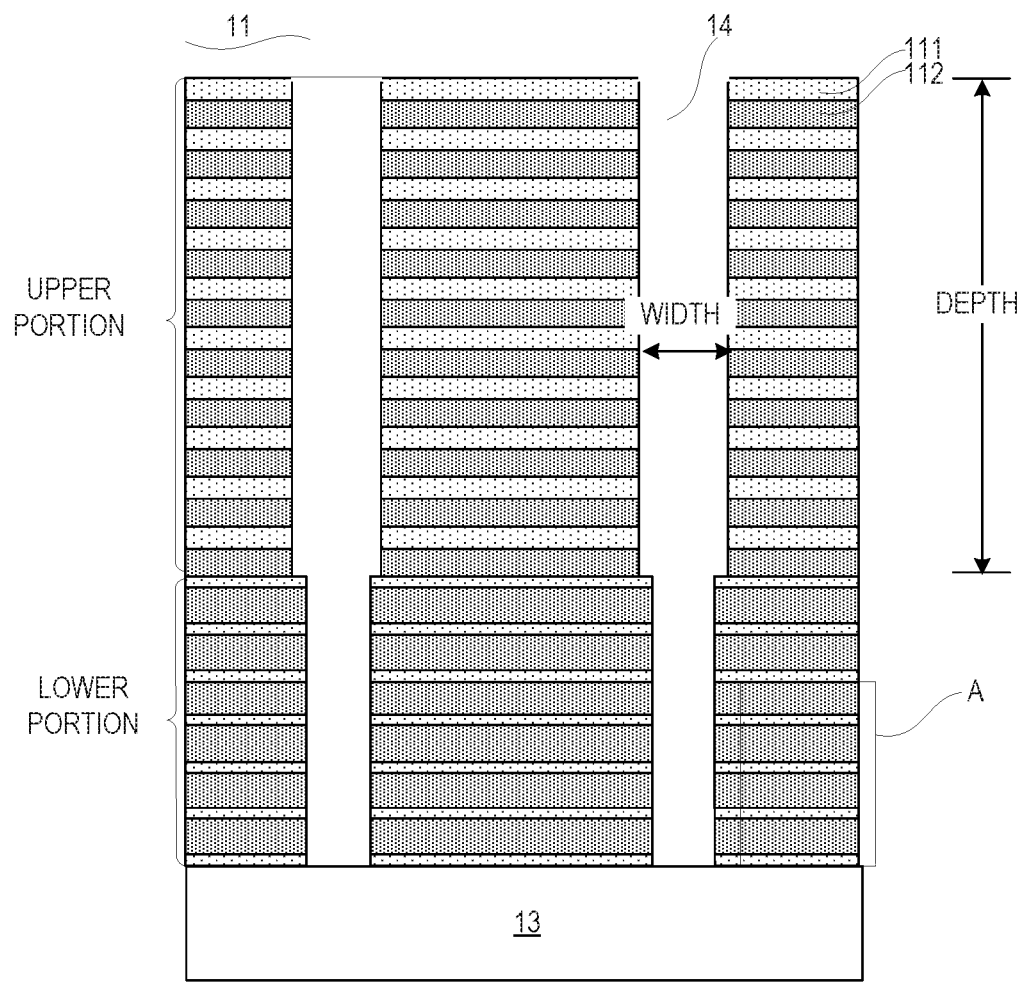
FIG. 1 illustrates a cross-sectional view of an exemplary 3D memory device, in which a width of a lower portion of a channel hole is less than a width of an upper portion of the channel hole, according to embodiments of the present disclosure.
Figure 1:
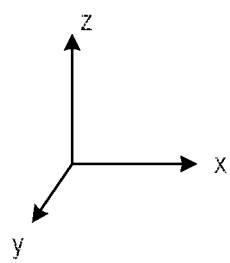
Figure 2:
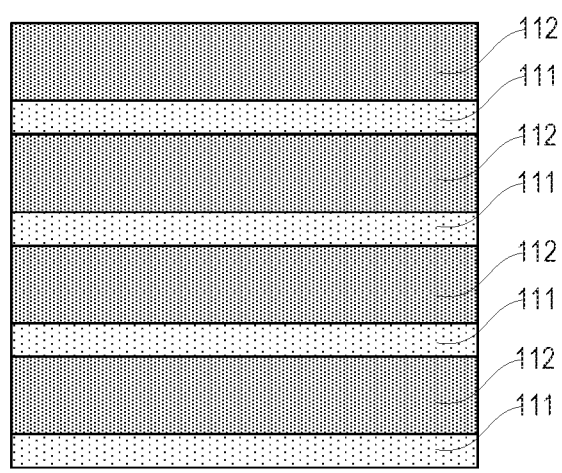
FIGS. 2-4 illustrate exemplary enlarged views of region A in FIG. 1, according to embodiments of the present disclosure.
Figure 2:
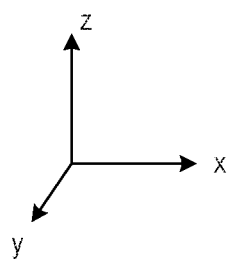

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for the formation of structures over it), and a vertical direction can refer to a direction (e.g., the z-axis) perpendicular to the top surface of the structure.

As used in herein, terms "proportional" and "nominally proportional" are interchangeable. In the present disclosure, "proportional" refers to corresponding to the size, degree, intensity, or similar, and should not be limited to a specific number or ratio. As used herein, terms "inversely proportional" and "nominally inversely proportional" are interchangeable. In the present disclosure, "inversely" refers to inversely corresponding to the size, degree, intensity, or similar, and should not be limited to a specific number or ratio.

In semiconductor fabrication, as the demand for higher memory density increases, the number of memory cells in a stack structure in a 3D memory device continues to increase, and an aspect ratio of a channel hole (CH) formed in a stack structure of the 3D memory device becomes higher. Because the fabrication of channel holes with higher aspect ratios are often limited by the etching process, the topography of the bottom portions of the channel holes is often undesirable. Defects, such as distortion or striation, often exist in the topography. Meanwhile, a width of a channel hole may vary. For example, of a channel hole, the critical dimension (CD) of the lower portion can be less than the CD of the upper portion. In an existing 3D memory device, the thicknesses of dielectric layers in a stack structure are the same along a vertical direction. Due to the defects described above, after a channel structure is formed, in the 3D memory device, the speed to program (PGM)/erase (ERS) a memory cell corresponding to a portion of a channel structure with a smaller width is often higher than the speed to program/erase a memory cell corresponding to a portion of a channel structure with a larger width. These memory cells corresponding to narrower channel structures are more susceptible to the disturbance caused by read operations and have undesirable erase state coupling effect. Thus, the properties of memory cells at different parts of the 3D memory device vary, resulting in the distribution of threshold voltage (Vt) of the memory cells to be undesirably wide, impairing the performance of the 3D memory device.

The present disclosure provides a 3D memory device and fabrication methods for forming the 3D memory device to solve the described issues in the existing 3D memory device. In the 3D memory device, the thicknesses of the conductor layers, which function as the gate electrodes of the memory cells, vary as the width of a channel structure, e.g., in contact with the conductor layers, vary along the vertical direction.

In some embodiments, the thicknesses of the dielectric layers, which function as the gate dielectric layers of the memory cells, vary as the width of a channel structure, e.g., in contact with the dielectric layers, vary along the vertical direction. In some embodiments, the variation of the thicknesses of the conductor layers has the same trend as the variation of the width of the channel structure. In some embodiments, the variation of the thicknesses of the dielectric layers has an opposite (e.g., inverse) trend versus the variation of the width of the channel structure. In some embodiments, the thicknesses of the conductor layers increase as the width of the channel structure increases, and the thicknesses of the conductor layers decrease as the width of the channel structure decreases. In some embodiments, the thicknesses of the dielectric layers decrease as the width of the channel structure increases, and the thicknesses of the dielectric layers increase as the width of the channel structure decreases. For example, the thickness of a conductor layer can be proportional to or nominally proportional to the width of the channel structure at the same depth, and/or the thickness of a dielectric layer can be inversely proportional to or nominally inversely proportional to the width of the channel structure at the same depth. The variation of the thicknesses of the conductor layers and/or dielectric layers can compensate for the impact caused by the variation of the width of the channel structure and the undesirable topography. The erase state coupling effect of the memory cells can be improved, and the performance of the memory cells have improved uniformity and stability. Also, the threshold voltages of the memory cells have improved uniformity. Meanwhile, the etching process to form channel holes can be less restrictive, improving fabrication stability and process window.

Figure 28:
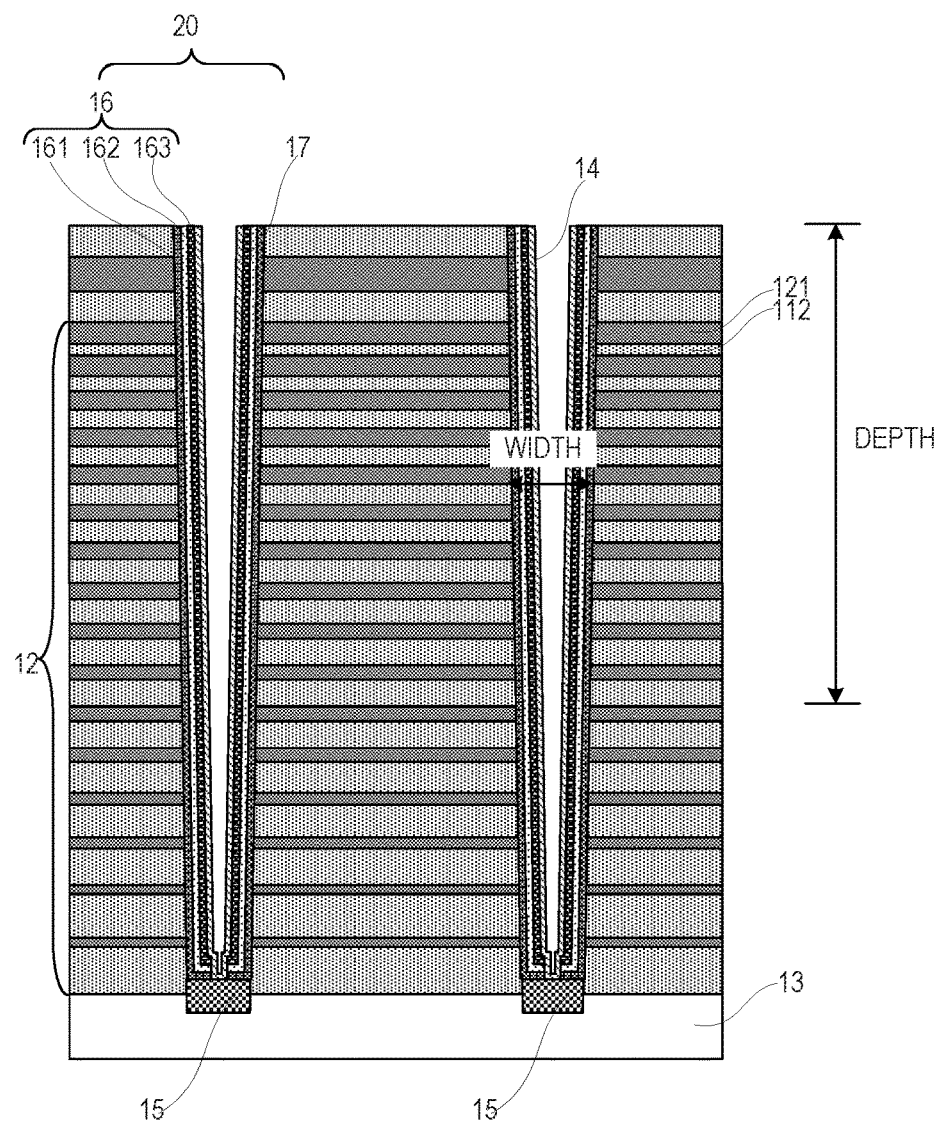

FIG. 28 illustrates a cross-sectional view of an exemplary 3D memory device 2800, according to some embodiments. As shown in FIG. 28, 3D memory device 2800 may include a substrate 13, a stack structure 12 over substrate 13, and a channel structure 20 extending in stack structure 12 and into substrate 13. In some embodiments, 3D memory device 2800 includes at least one source contact structure (not shown) extending in stack structure 12 and into substrate 13.

Substrate 13 may include any suitable semiconductor material(s). In some embodiments, substrate 13 includes at least one of silicon, germanium (Ge), silicon germanium (SiGe), silicon-on-insulator (SDI), germanium-on-insulator (GOI), etc. In some embodiments, substrate 13 includes a monocrystalline silicon wafer. In some embodiments, substrate 13 includes an ion-doped substrate. Specifically, substrate 13 may be a P-type doped substrate or an N-type doped substrate.

Stack structure 12 may include interleaved a plurality of conductor layers 121 and dielectric layers 112 arranged over substrate 13. Conductor layers 121 and dielectric layers 112 may be arranged alternatingly along a vertical direction (e.g., the z-axis). Conductor layers 121 may include any suitable conductor material such as tungsten, polysilicon, cobalt, copper, silicides, and/or aluminum. Dielectric layers 112 may include any suitable dielectric material such as silicon oxide and/or silicon oxynitride.

Channel structure 20 may include a semiconductor plug 15 at the bottom and in contact with substrate 13, a functional sidewall 16 (or a functional layer 16) over and in contact with semiconductor plug 15, and a channel layer 17 over functional sidewall 16 and in contact with semiconductor plug 15. Semiconductor plug 15 may be a deposited and/or an epitaxially grown semiconductor layer at the bottom of channel structure 20. In some embodiments, semiconductor plug 15 forms a channel region for the source line transistors. Semiconductor plug 15 may include a suitable semiconductor material. In some embodiments, substrate 13 includes silicon and semiconductor plug 15 includes single crystalline silicon.

In some embodiments, functional sidewall 16 includes a blocking layer 161, a charge trapping layer 162 over blocking layer 161, and a tunneling layer 163 over charge trapping layer 162. In some embodiments, channel layer 17 is over charge trapping layer 162. In some embodiments, blocking layer 161, charge trapping layer 162, tunneling layer 163, and channel layer 17 are arranged radially and inwardly in channel structure 20. In some embodiments, channel structure 20 includes a dielectric core that partially or fully fills up the space surrounded by channel layer 17. In some embodiments, blocking layer 161 includes, but not limited to, silicon oxide, and/or hafnium oxide. In some embodiments, charge trapping layer 162 includes, but not only limited to, silicon oxide, silicon oxynitride, silicon nitride, silicon, and/or hafnium oxide. In some embodiments, tunneling layer 163 includes silicon oxide, silicon oxynitride, and/or hafnium oxide. In some embodiments, channel layer 17 includes polycrystalline silicon, single crystalline silicon, and/or amorphous silicon. In some embodiments, channel layer 17 further includes other semiconductor material(s). In some embodiments, the dielectric core includes oxide dielectric materials, such as silicon oxide.

In some embodiments, the at least one source contact structure extends laterally and vertically in stack structure 12. Each source contact structure may include an insulating structure and a contact in the insulating structure. The insulating structure may include any suitable dielectric material such as silicon oxide, and the contact may include one or more of tungsten, polysilicon, cobalt, aluminum, and copper. The contact may be in contact and conductively connected to substrate 13. Optionally, the source contact structure may include a doped region in substrate 13 at the bottom of the GLS. The contact may be conductively connected to substrate 13 through the doped region (if any).

In stack structure 12, at least one conductor layer 121 has a thickness that is nominally proportional to a width of channel structure 20 at the same depth. In some embodiments, at least one dielectric layer 112 has a thickness that is nominally inversely proportional to a width of channel structure 20 at the same depth. In the present disclosure, a width of a channel structure/hole is defined as a distance between sidewalls of the channel structure/hole along a horizontal direction, e.g., the x-axis, and a depth of a channel hole/structure is defined as a distance between the top surface of stack structure 12 and any point between the top and bottom surfaces of stack structure 12. A depth range is defined as a range of different depths along the vertical direction. In some embodiments, the width of channel structure 20 may vary along the vertical direction. The variation may be limited to only a part of channel structure 20 or the entire channel structure 20. In some embodiments, the variation of the thickness of at least a portion of conductor layers 121 has the same trend as the variation of the width of channel structure 20, and/or the variation of the thickness of at least a portion of dielectric layers 112 has the inverse/opposite trend versus the variation of the width of channel structure 20. For example, the width of channel structure 20 may vary in a trend (e.g., increasing, decreasing, unchanged) in a depth range along the vertical direction, and the thicknesses of conductor layers 121 in this depth range may vary in the same trend. In some embodiments, the thicknesses of dielectric layers 112 in this depth range may vary in an opposite trend. In some embodiments, the thicknesses of at least a portion of conductor layers 121 are nominally proportional to the width of channel structure 20 at respective depths, and/or the thicknesses of at least a portion of dielectric layers 112 are nominally inversely proportional to the width of channel structure 20 at respective depths. In some embodiments, at the same depth range(s), the thicknesses of conductor layers 121 are nominally proportional to the width of channel structure 20, and the thickness of dielectric layers 112 are nominally inversely proportional to the width of channel structure 20. In some embodiments, the thicknesses of all conductor layers 121 are nominally proportional to the width of channel structure 20 at the respective (e.g., same) depth, and the thicknesses of all dielectric layers 112 are nominally inversely proportional to the width of channel structure 20 at the respective (e.g., same) depth. Details of the variation of the width of channel structure/hole and that of the thicknesses of conductor layers and dielectric layers are described below.

FIGS. 1-10 of the present disclosure each illustrates a cross-sectional view of a 3D memory device before a gate replacement, according to some embodiments. FIGS. 11-20 of the present disclosure each illustrates a cross-sectional view of the 3D memory device after a gate replacement, according to some embodiments.

As shown in FIG. 1, a 3D memory device may include a stack structure 11 that has interleaved a plurality of sacrificial layers 111 and dielectric layers 112 along a vertical direction, e.g., the z-axis or also referred to as a thickness direction, over a substrate 13. Stack structure 11 may be referred to as a dielectric stack. The 3D memory device may also include one or more channel holes 14 extending through stack structure 11 along the vertical direction. The width of channel hole 14 may vary along the vertical direction, e.g., at different depths. In some embodiments, the variation of thicknesses of sacrificial layers 111 may have the same trend as the width of the channel hole 14 along the vertical direction. In some embodiments, the variation of thicknesses of dielectric layers 112 may have the opposite trend versus the width of the channel hole 14 along the vertical direction. For example, the width of a portion (or the entirety) of channel hole 14 may decrease (or increase) along the vertical direction. At the same depths, the thicknesses of a portion (or the entirety) of sacrificial layers 111 may decrease (or increase) along the vertical direction, and/or the thicknesses of a portion (or the entirety) of dielectric layers 112 may increase (or decrease) along the vertical direction. In some embodiments, a thickness of sacrificial layer 111 is proportional to (or nominally proportional to) a width of channel hole 14 at the same depth, and/or a thickness of dielectric layer 112 is inversely proportional to (or nominally inversely proportional to) a width of channel hole 14 at the same depth.

In various embodiments, stack structure 11 can be divided into a plurality of portions. Accordingly, channel hole 14 may be divided into the plurality of portions. In some embodiments, the width of channel hole 14 in each portion may be nominally the same. In each portion, the thicknesses of sacrificial layers 111 may vary in the same trend as the width of channel hole 14, and/or the thicknesses of dielectric layers 112 may vary in the opposite trend versus the width of channel hole 14. In some embodiments, in each portion, the variation of the thicknesses of sacrificial layers 111 has the same trend as the variation of the width of channel hole 14 in the same portion, and/or the variation of the thicknesses of dielectric layers 112 has the opposite trend versus the variation of the width of channel hole 14 in the same portion. In some embodiments, in each portion, the thicknesses of sacrificial layers 111 are nominally proportional to the width of channel hole 14 in the same portion, and/or the thicknesses of dielectric layers 112 are nominally inversely proportional to the width of channel hole 14 in the same portion. In some embodiments, stack structure 11 is divided into an upper portion and a lower portion along the vertical direction. For example, the upper portion is above the lower portion. The ratio (e.g., a first ratio) of the total thickness of the upper portion of stack structure 11 to the total thickness of stack structure 11 may be any suitable fraction between 0 and 1, depending on the fabrication process and/or design. The ratio (e.g., a second ratio) of the total thickness of the lower portion of stack structure 11 to the total thickness of stack structure 11 may be any suitable fraction between 0 and 1, depending on the fabrication process and/or design. In some embodiments, the sum of the first ratio and the second ratio is equal to 1.

In one example, the upper portion and the lower portion of stack structure 11 may each be one half of stack structure 11. The is, the lower portion of stack structure 11 may be from a bottom surface of stack structure 11 to a middle position of stack structure 11. A portion above the lower portion of stack structure 11 is the upper portion of stack structure 11. That is, the total thicknesses of the lower portion and the upper portion of stack structure 11 may each be one half of the total thickness of stack structure 11. In another example, the thickness of the lower portion of stack structure 11 may be less than or equal to ⅓ of the total thickness of stack structure 11.

Sacrificial layers 111 and dielectric layers 112 may include different materials. In some embodiments, dielectric layers 112 include silicon dioxide, low-k silicon dioxide, and/or silicon oxycarbide (SiCO), etc. In some embodiments, sacrificial layers 111 include silicon nitride, polycrystalline silicon, carbon, and/or organics materials.

In one example, as shown in FIG. 1, the width of the lower portion of channel hole 14 is less than the width of the upper portion of channel hole 14. In some embodiments, when the width of the lower portion of channel hole 14 is less than the width of the upper portion of channel hole 14, at least one of the following scenarios can happen. In some embodiments, as shown in region A in FIG. 2, the thicknesses of sacrificial layers 111 located in the lower portion of stack structure 11 are less than the thicknesses of sacrificial layers 111 located in the upper portion of stack structure 11, the thickness of each of sacrificial layers 111 in the lower portion is the same, and the thickness of each of sacrificial layers 111 in the upper portion is the same. In some embodiments, the thicknesses of dielectric layers 112 located in the lower portion of stack structure 11 are greater than the thicknesses of dielectric layers 112 located in the upper portion of stack structure 11, the thickness of each of dielectric layers 112 in the lower portion is the same, and the thickness of each of dielectric layers 112 in the upper portion is the same.

The variations of the thicknesses of sacrificial layers 111 and dielectric layers 112 may be separate (e.g., independent) or simultaneous. In some embodiments, the thicknesses of sacrificial layers 111 in the lower portion of stack structure 11 are the same, and the thicknesses of dielectric layers 112 in the lower portion are greater than the thicknesses of dielectric layers 112 in the upper portion of stack structure 11. In the meantime, the variation of the thicknesses of dielectric layers 112 in the upper portions and/or lower portions of stack structure 11 may be independent of the variation of the thicknesses of sacrificial layers 111. For example, the thicknesses of dielectric layers 112 in the lower portion of stack structure 11 may be the same or different, and the thicknesses of dielectric layers 112 in the upper portion of stack structure 11 may be the same or different. In each of the upper and lower portions of stack structure 11, the thicknesses of dielectric layers 112 may stay unchanged, or increase and/or decrease, e.g., gradually (e.g., change layer by layer) or abruptly (e.g., change every a few layers). Similarly, in some embodiments, the thicknesses of dielectric layers 112 in the lower portion of stack structure 11 are the same, and the thicknesses of sacrificial layers 111 in the lower portion are less than the thicknesses of sacrificial layers 111 in the upper portion of stack structure 11. In the meantime, the variation of the thicknesses of sacrificial layers 111 in the upper portions and/or lower portions of stack structure 11 may be independent of the variation of the thicknesses of dielectric layers 112. For example, the thicknesses of sacrificial layers 111 in the lower portion of stack structure 11 may be the same or different, and the thicknesses of sacrificial layers 111 in the upper portion of stack structure 11 may be the same or different. In each of the upper and lower portions of stack structure 11, the thicknesses of sacrificial layers 111 may stay unchanged, or increase and/or decrease, e.g., gradually (e.g., change layer by layer) or abruptly (e.g., change every a few layers).

Figure 3:
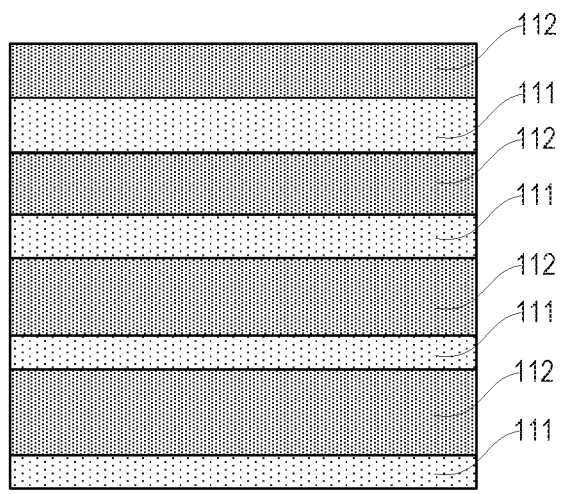
Figure 3:
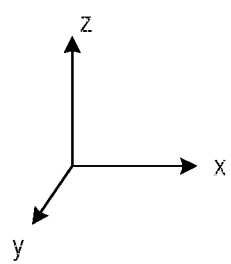
Figure 4:
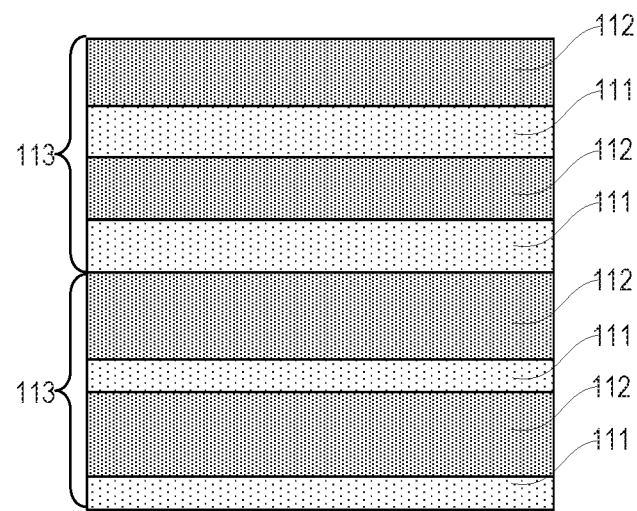
Figure 4:
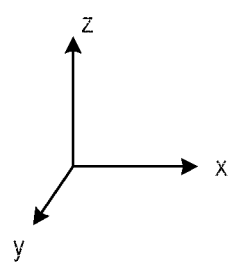

FIGS. 3 and 4 show additional thickness configurations of sacrificial layers 111 and dielectric layers 112 in region A in the lower portion of stack structure 11. In some embodiments, as shown in FIG. 3, the thicknesses of sacrificial layers 111 located in the lower portion of stack structure 11 are less than the thicknesses of sacrificial layers 111 located in the upper portion of stack structure 11, and the thicknesses of sacrificial layers 111 located in the lower portion increases, e.g., gradually from bottom to top or layer by layer, as the depth decreases. Simultaneously or optionally, in some embodiments, the thicknesses of dielectric layers 112 located in the lower portion of stack structure 11 are greater than the thicknesses of dielectric layers 112 located in the upper portion of stack structure 11, and the thicknesses of dielectric layers 112 located in the lower portion decreases, e.g., gradually from bottom to top or layer by layer, as the depth decreases. In some embodiments, the thicknesses of sacrificial layers 111 located in the lower portion increases, e.g., layer by layer, as the depth decreases, the thicknesses of dielectric layers 112 in the lower portion are greater than the thicknesses of dielectric layers 112 in the upper portion, and the thicknesses of dielectric layers 112 in the lower portion may be the same or different. For example, the thicknesses of dielectric layers 112 in the lower portion may increase, stay unchanged, and/or decrease along the vertical direction (e.g., gradually such as layer by layer, or abruptly such as in every a few layers). Similarly, in some embodiments, the thicknesses of dielectric layers 112 located in the lower portion decreases, e.g., layer by layer, as the depth increases, the thicknesses of sacrificial layers 111 in the lower portion are less than the thicknesses of dielectric layers 112 in the upper portion, and the thicknesses of sacrificial layers 111 in the lower portion may be the same or different. For example, the thicknesses of sacrificial layers 111 in the lower portion may increase, stay unchanged, and/or decrease along the vertical direction (e.g., gradually such as layer by layer, or abruptly such as in every a few layers).

In some embodiments, as shown in FIG. 4, the thicknesses of sacrificial layers 111 located in the lower portion of stack structure 11 are less than the thicknesses of sacrificial layers 111 located in the upper portion of stack structure 11, and sacrificial layers 111 and dielectric layers 112 located in the lower portion of are divided into a plurality of divisions 113. Each division 113 may include a number of (e.g., at least one) sacrificial layers 111 and a number (e.g., at least one) dielectric layers 112, and the thicknesses of sacrificial layers 111 in the same division may be the same. The thicknesses of sacrificial layers 111 in different divisions 113 may increase, e.g., gradually from bottom to top, as the depth decreases. In some embodiments, the thicknesses of dielectric layers 112 in the same division 113 are the same. In some embodiments, the thicknesses of dielectric layers 112 in different divisions 113 may decrease, e.g., gradually from bottom to top or layer by layer, as the depth decreases.

In some embodiments, the thicknesses of dielectric layers 112 located in the lower portion of stack structure 11 are greater than the thicknesses of dielectric layers 112 located in the upper portion of stack structure 11. The thicknesses of dielectric layers 112 in the same division may be the same. The thicknesses of dielectric layers 112 in different divisions 113 may decrease, e.g., gradually from bottom to top, as the depth decreases. In some embodiments, the thicknesses of sacrificial layers 111 in the same division 113 are the same. In some embodiments, the thicknesses of sacrificial layers 111 in different divisions 113 may increase, e.g., gradually from bottom to top or layer by layer, as the depth decreases.

In some embodiments, the thicknesses of sacrificial layers 111 located in the lower portion of stack structure 11 are less than the thicknesses of sacrificial layers 111 located in the upper portion of stack structure 11, and the thicknesses of sacrificial layers 111 located in the upper portion decreases, e.g., gradually from top to bottom or layer by layer, as the depth increases. Simultaneously or optionally, in some embodiments, the thicknesses of dielectric layers 112 located in the lower portion of stack structure 11 are greater than the thicknesses of dielectric layers 112 located in the upper portion of stack structure 11, and the thicknesses of dielectric layers 112 located in the upper portion increases, e.g., gradually from top to bottom or layer by layer, as the depth increases. In some embodiments, the thicknesses of sacrificial layers 111 located in the upper portion decreases, e.g., layer by layer, as the depth increases, the thicknesses of dielectric layers 112 in the lower portion are greater than the thicknesses of dielectric layers 112 in the upper portion, and the thicknesses of dielectric layers 112 in the upper portion may be the same or different. For example, the thicknesses of dielectric layers 112 in the upper portion may increase, stay unchanged, and/or decrease along the vertical direction (e.g., gradually such as layer by layer, or abruptly such as in every a few layers). Similarly, in some embodiments, the thicknesses of dielectric layers 112 located in the upper portion increases, e.g., layer by layer, as the depth increases, the thicknesses of sacrificial layers 111 in the lower portion are less than the thicknesses of dielectric layers 112 in the upper portion, and the thicknesses of sacrificial layers 111 in the upper portion may be the same or different. For example, the thicknesses of sacrificial layers 111 in the upper portion may increase, stay unchanged, and/or decrease along the vertical direction (e.g., gradually such as layer by layer, or abruptly such as in every a few layers).

In some embodiments, the thicknesses of sacrificial layers 111 located in the lower portion of stack structure 11 are less than the thicknesses of sacrificial layers 111 located in the upper portion of stack structure 11, and sacrificial layers 111 and dielectric layers 112 located in the upper portion are divided into a plurality of divisions, similar to divisions 113. Each division may include a number of sacrificial layers 111 and a number of dielectric layers 112, and the thicknesses of sacrificial layers 111 in the same division may be the same. The thicknesses of sacrificial layers 111 in different divisions may decrease, e.g., gradually from top to bottom, as depth increases. The thicknesses of dielectric layers 112 in the same division may be the same. The thicknesses of dielectric layers 112 in different divisions may increase, e.g., gradually from top to bottom, as depth increases.

In another example, the width of the upper portion of channel hole 14 is less than the width of the lower portion of channel hole 14. In some embodiments, when the width of the upper portion of channel hole 14 is less than the width of lower portion of channel hole 14, at least one of the following scenarios can happen. In some embodiments, the thicknesses of sacrificial layers 111 located in the upper portion of stack structure 11 are less than the thicknesses of sacrificial layers 111 located in the lower portion of stack structure 11, the thickness of each of sacrificial layers 111 in the lower portion is the same, and the thickness of each of sacrificial layers 111 in the upper portion is the same. In some embodiments, the thicknesses of dielectric layers 112 located in the upper portion of stack structure 11 are greater than the thicknesses of dielectric layers 112 located in the lower portion of stack structure 11, the thickness of each of dielectric layers 112 in the lower portion is the same, and the thickness of each of dielectric layers 112 in the upper portion is the same.

As described previously, the variations of the thicknesses of sacrificial layers 111 and dielectric layers 112 may be separate (e.g., independent) or simultaneous. In some embodiments, the thicknesses of sacrificial layers 111 in the upper portion of stack structure 11 are the same, and the thicknesses of dielectric layers 112 in the upper portion are greater than the thicknesses of sacrificial layers 111 in the lower portion of stack structure 11. In the meantime, the variation of the thicknesses of dielectric layers 112 in the upper portions and/or lower portions of stack structure 11 may be independent of the variation of the thicknesses of sacrificial layers 111. For example, the thicknesses of dielectric layers 112 in the lower portion of stack structure 11 may be the same or different, and the thicknesses of dielectric layers 112 in the upper portion of stack structure 11 may be the same or different. In each of the upper and lower portions of stack structure 11, the thicknesses of dielectric layers 112 may stay unchanged, or increase and/or decrease, e.g., gradually (e.g., change layer by layer) or abruptly (e.g., change every a few layers). Similarly, in some embodiments, the thicknesses of dielectric layers 112 in the upper portion of stack structure 11 are the same, and the thicknesses of sacrificial layers 111 in the upper portion are less than the thicknesses of sacrificial layers 111 in the lower portion of stack structure 11. In the meantime, the variation of the thicknesses of sacrificial layers 111 in the upper portions and/or lower portions of stack structure 11 may be independent from the variation of the thicknesses of dielectric layers 112. For example, the thicknesses of sacrificial layers 111 in the lower portion of stack structure 11 may be the same or different, and the thicknesses of sacrificial layers 111 in the upper portion of stack structure 11 may be the same or different. In each of the upper and lower portions of stack structure 11, the thicknesses of sacrificial layers 111 may stay unchanged, or increase and/or decrease, e.g., gradually (e.g., change layer by layer) or abruptly (e.g., change every a few layers).

In some embodiments, the thicknesses of sacrificial layers 111 located in the lower portion of stack structure 11 are less than the thicknesses of sacrificial layers 111 located in the upper portion of stack structure 11, and the thicknesses of sacrificial layers 111 located in the lower portion increases, e.g., gradually from bottom to top or layer by layer, as the depth decreases. Simultaneously or optionally, in some embodiments, the thicknesses of dielectric layers 112 located in the lower portion of stack structure 11 are greater than the thicknesses of dielectric layers 112 located in the upper portion of stack structure 11, and the thicknesses of dielectric layers 112 located in the lower portion decreases, e.g., gradually from bottom to top or layer by layer, as the depth decreases. In some embodiments, the thicknesses of sacrificial layers 111 located in the lower portion increase, e.g., layer by layer, as the depth decreases, and the thicknesses of dielectric layers 112 in the lower portion are greater than the thicknesses of dielectric layers 112 in the upper portion. In the meantime, the thicknesses of dielectric layers 112 in the lower portion may be the same or different. For example, the thicknesses of dielectric layers 112 in the lower portion may increase, stay unchanged, and/or decrease along the vertical direction (e.g., gradually such as layer by layer, or abruptly such as in every a few layers). Similarly, in some embodiments, the thicknesses of dielectric layers 112 located in the lower portion decrease, e.g., layer by layer, as the depth increases, and the thicknesses of sacrificial layers 111 in the lower portion are less than the thicknesses of sacrificial layers 111 in the upper portion. In the meantime, the thicknesses of sacrificial layers 111 in the lower portion may be the same or different. For example, the thicknesses of sacrificial layers 111 in the lower portion may increase, stay unchanged, and/or decrease along the vertical direction (e.g., gradually such as layer by layer, or abruptly such as in every a few layers).

In some embodiments, the thicknesses of sacrificial layers 111 located in the lower portion of stack structure 11 are less than the thicknesses of sacrificial layers 111 located in the upper portion of stack structure 11, and sacrificial layers 111 and dielectric layers 112 located in the lower portion of are divided into a plurality of divisions 113. Each division 113 may include a number of (e.g., at least one) sacrificial layers 111 and a number (e.g., at least one) dielectric layers 112, and the thicknesses of sacrificial layers 111 in the same division may be the same. The thicknesses of sacrificial layers 111 in different divisions 113 may increase, e.g., gradually from bottom to top, as the depth decreases. In some embodiments, the thicknesses of dielectric layers 112 located in the lower portion of stack structure 11 are greater than the thicknesses of dielectric layers 112 located in the upper portion of stack structure 11. In some embodiments, the thicknesses of dielectric layers 112 in the same division 113 are the same. In some embodiments, the thicknesses of dielectric layers 112 in different divisions 113 may decrease, e.g., gradually from bottom to top or layer by layer, as the depth decreases. In some embodiments, in the same division 113, the thicknesses of sacrificial layers 111 are the same, and the thicknesses of dielectric layers are the same. In the meantime, in different divisions 113, as the depth decreases, the thicknesses of sacrificial layers 111 increase gradually, and the thicknesses of dielectric layers 112 decrease gradually.

In some embodiments, the thicknesses of sacrificial layers 111 located in the lower portion of stack structure 11 are less than the thicknesses of sacrificial layers 111 located in the upper portion of stack structure 11, and the thicknesses of sacrificial layers 111 located in the upper portion decreases, e.g., gradually from top to bottom or layer by layer, as the depth increases. Simultaneously or optionally, in some embodiments, the thicknesses of dielectric layers 112 located in the lower portion of stack structure 11 are greater than the thicknesses of dielectric layers 112 located in the upper portion of stack structure 11, and the thicknesses of dielectric layers 112 located in the upper portion increases, e.g., gradually from top to bottom or layer by layer, as the depth increases. In some embodiments, the thicknesses of sacrificial layers 111 located in the upper portion decrease, e.g., layer by layer, as the depth increases, and the thicknesses of dielectric layers 112 in the lower portion are greater than the thicknesses of dielectric layers 112 in the upper portion. In the meantime, the thicknesses of dielectric layers 112 in the upper portion may be the same or different. For example, thicknesses of dielectric layers 112 in the upper portion may increase, stay unchanged, and/or decrease along the vertical direction (e.g., gradually such as layer by layer, or abruptly such as in every a few layers). Similarly, in some embodiments, the thicknesses of dielectric layers 112 located in the upper portion increase, e.g., layer by layer, as the depth increases, and the thicknesses of sacrificial layers 111 in the lower portion are less than the thicknesses of sacrificial layers 111 in the upper portion. In the meantime, the thicknesses of sacrificial layers 111 in the upper portion may be the same or different. For example, the thicknesses of sacrificial layers 111 in the upper portion may increase, stay unchanged, and/or decrease along the vertical direction (e.g., gradually such as layer by layer, or abruptly such as in every a few layers).

In some embodiments, the thicknesses of sacrificial layers 111 located in the lower portion of stack structure 11 are less than the thicknesses of sacrificial layers 111 located in the upper portion of stack structure 11, and sacrificial layers 111 and dielectric layers 112 located in the upper portion are divided into a plurality of divisions, similar to divisions 113. Each division may include a number of sacrificial layers 111 and a number of dielectric layers 112, and the thicknesses of sacrificial layers 111 in the same division may be the same. The thicknesses of sacrificial layers 111 in different divisions may decrease, e.g., gradually from top to bottom, as depth increases. The thicknesses of dielectric layers 112 in the same division may be the same. The thicknesses of dielectric layers 112 in different divisions may increase, e.g., gradually from top to bottom, as depth increases. In some embodiments, in the same division, the thicknesses of sacrificial layers 111 are the same, and the thicknesses of dielectric layers are the same. In the meantime, in different divisions, as the depth increases, the thicknesses of sacrificial layers 111 decrease gradually, and the thicknesses of dielectric layers 112 increase gradually.

In some embodiments, the width of the upper portion of channel hole 14 is less than the width of the lower portion of channel hole 14. In some embodiments, when the width of the upper portion of channel hole 14 is less than the width of lower portion of channel hole 14, at least one of the following scenarios can happen. In some embodiments, the thicknesses of sacrificial layers 111 located in the upper portion of stack structure 11 are less than the thicknesses of sacrificial layers 111 located in the lower portion of stack structure 11, the thickness of each of sacrificial layers 111 in the lower portion is the same, and the thickness of each of sacrificial layers 111 in the upper portion is the same. In some embodiments, the thicknesses of dielectric layers 112 located in the upper portion of stack structure 11 are greater than the thicknesses of dielectric layers 112 located in the lower portion of stack structure 11, the thickness of each of dielectric layers 112 in the lower portion is the same, and the thickness of each of dielectric layers 112 in the upper portion is the same.

As described previously, the variations of the thicknesses of sacrificial layers 111 and dielectric layers 112 may be separate (e.g., independent) or simultaneous. In some embodiments, the thicknesses of sacrificial layers 111 in the upper portion of stack structure 11 are the same, and the thicknesses of dielectric layers 112 in the upper portion are greater than the thicknesses of dielectric layers 112 in the lower portion of stack structure 11. In the meantime, the variation of the thicknesses of dielectric layers 112 in the upper portions and/or lower portions of stack structure 11 may be independent of the variation of the thicknesses of sacrificial layers 111. For example, the thicknesses of dielectric layers 112 in the upper portion of stack structure 11 may be the same or different, and the thicknesses of dielectric layers 112 in the lower portion of stack structure 11 may be the same or different. In each of the upper and lower portions of stack structure 11, the thicknesses of dielectric layers 112 may stay unchanged, or increase and/or decrease, e.g., gradually (e.g., change layer by layer) or abruptly (e.g., change every a few layers). Similarly, in some embodiments, the thicknesses of dielectric layers 112 in the upper portion of stack structure 11 are the same, and the thicknesses of sacrificial layers 111 in the upper portion are less than the thicknesses of sacrificial layers 111 in the lower portion of stack structure 11. In the meantime, the variation of the thicknesses of sacrificial layers 111 in the upper portions and/or lower portions of stack structure 11 may be independent of the variation of the thicknesses of dielectric layers 112. For example, the thicknesses of sacrificial layers 111 in the upper portion of stack structure 11 may be the same or different, and the thicknesses of sacrificial layers 111 in the lower portion of stack structure 11 may be the same or different. In each of the upper and lower portions of stack structure 11, the thicknesses of sacrificial layers 111 may stay unchanged, increase, and/or decrease, e.g., gradually (e.g., change layer by layer) or abruptly (e.g., change every a few layers).

In some embodiments, the thicknesses of sacrificial layers 111 located in the upper portion of stack structure 11 are less than the thicknesses of sacrificial layers 111 located in the lower portion of stack structure 11, and the thicknesses of sacrificial layers 111 located in the upper portion increases, e.g., gradually from top to bottom or layer by layer, as the depth increases. Simultaneously or optionally, in some embodiments, the thicknesses of dielectric layers 112 located in the upper portion of stack structure 11 are greater than the thicknesses of dielectric layers 112 located in the lower portion of stack structure 11, and the thicknesses of dielectric layers 112 located in the upper portion decreases, e.g., gradually from top to bottom or layer by layer, as the depth increases. In some embodiments, the thicknesses of sacrificial layers 111 located in the upper portion increases, e.g., layer by layer, as the depth increases, the thicknesses of dielectric layers 112 in the upper portion are greater than the thicknesses of dielectric layers 112 in the lower portion, and the thicknesses of dielectric layers 112 in the upper portion may be the same or different. For example, the thicknesses of dielectric layers 112 in the upper portion may increase, stay unchanged, and/or decrease along the vertical direction (e.g., gradually such as layer by layer, or abruptly such as in every a few layers). Similarly, in some embodiments, the thicknesses of dielectric layers 112 located in the upper portion increases, e.g., layer by layer, as the depth increases, the thicknesses of sacrificial layers 111 in the upper portion are less than the thicknesses of dielectric layers 112 in the lower portion, and the thicknesses of sacrificial layers 111 in the upper portion may be the same or different. For example, the thicknesses of sacrificial layers 111 in the upper portion may increase, stay unchanged, and/or decrease along the vertical direction (e.g., gradually such as layer by layer, or abruptly such as in every a few layers).

In some embodiments, the thicknesses of sacrificial layers 111 located in the upper portion of stack structure 11 are less than the thicknesses of sacrificial layers 111 located in the lower portion of stack structure 11, and sacrificial layers 111 and dielectric layers 112 located in the upper portion of are divided into a plurality of divisions, similar to divisions 113. Each division may include a number of (e.g., at least one) sacrificial layers 111 and a number (e.g., at least one) dielectric layers 112, and the thicknesses of sacrificial layers 111 in the same division may be the same. The thicknesses of sacrificial layers 111 in different divisions may increase, e.g., gradually from top to bottom, as the depth increases. In some embodiments, the thicknesses of dielectric layers 112 in the same division are the same. In some embodiments, the thicknesses of dielectric layers 112 in different divisions may decrease, e.g., gradually from top to bottom or layer by layer, as the depth increases.

In some embodiments, the thicknesses of dielectric layers 112 located in the lower portion of stack structure 11 are greater than the thicknesses of dielectric layers 112 located in the upper portion of stack structure 11. The thicknesses of dielectric layers 112 in the same division may be the same. The thicknesses of dielectric layers 112 in different divisions 113 may decrease, e.g., gradually from bottom to top, as the depth decreases. In some embodiments, the thicknesses of sacrificial layers 111 in the same division 113 are the same. In some embodiments, the thicknesses of sacrificial layers 111 in different divisions 113 may increase, e.g., gradually from bottom to top or layer by layer, as the depth decreases.

In some embodiments, the thicknesses of sacrificial layers 111 located in the upper portion of stack structure 11 are less than the thicknesses of sacrificial layers 111 located in the lower portion of stack structure 11, and the thicknesses of sacrificial layers 111 located in the lower portion decreases, e.g., gradually from bottom to top or layer by layer, as the depth decreases. Simultaneously or optionally, in some embodiments, the thicknesses of dielectric layers 112 located in the upper portion of stack structure 11 are greater than the thicknesses of dielectric layers 112 located in the lower portion of stack structure 11, and the thicknesses of dielectric layers 112 located in the lower portion increases, e.g., gradually from bottom to top or layer by layer, as the depth decreases. In some embodiments, the thicknesses of sacrificial layers 111 located in the lower portion decreases, e.g., layer by layer, as the depth decreases, the thicknesses of dielectric layers 112 in the upper portion are greater than the thicknesses of dielectric layers 112 in the lower portion, and the thicknesses of dielectric layers 112 in the lower portion may be the same or different. For example, the thicknesses of dielectric layers 112 in the lower portion may increase, stay unchanged, and/or decrease along the vertical direction (e.g., gradually such as layer by layer, or abruptly such as in every a few layers). Similarly, in some embodiments, the thicknesses of dielectric layers 112 located in the lower portion increases, e.g., layer by layer, as the depth decreases, the thicknesses of sacrificial layers 111 in the upper portion are less than the thicknesses of dielectric layers 112 in the lower portion, and the thicknesses of sacrificial layers 111 in the lower portion may be the same or different. For example, the thicknesses of sacrificial layers 111 in the lower portion may increase, stay unchanged, and/or decrease along the vertical direction (e.g., gradually such as layer by layer, or abruptly such as in every a few layers).

In some embodiments, the thicknesses of sacrificial layers 111 located in the upper portion of stack structure 11 are less than the thicknesses of sacrificial layers 111 located in the lower portion of stack structure 11, and sacrificial layers 111 and dielectric layers 112 located in the lower portion are divided into a plurality of divisions, similar to divisions 113. Each division may include a number of sacrificial layers 111 and a number of dielectric layers 112, and the thicknesses of sacrificial layers 111 in the same division may be the same. The thicknesses of sacrificial layers 111 in different divisions may decrease, e.g., gradually from bottom to top, as depth decreases. The thicknesses of dielectric layers 112 in the same division may be the same. The thicknesses of dielectric layers 112 in different divisions may increase, e.g., gradually from bottom to top, as depth increases.

Figure 5:
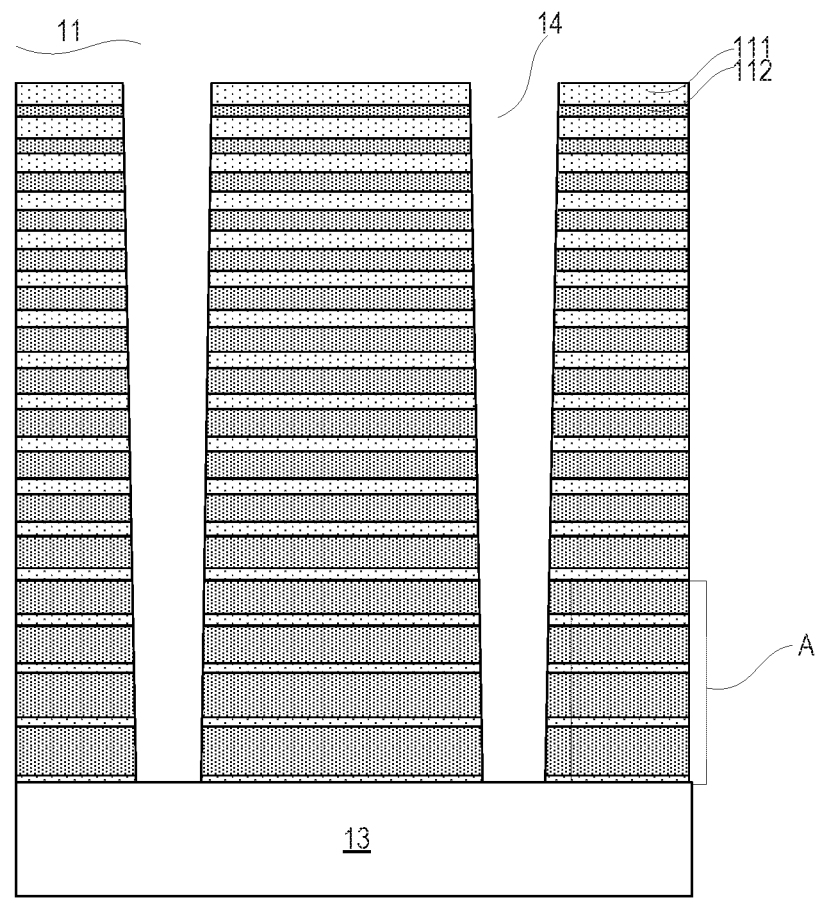
FIG. 5 illustrates a cross-sectional view of an exemplary 3D memory device, in which a width of a channel hole decreases as a depth of the channel hole increases, according to embodiments of the present disclosure.
Figure 6:
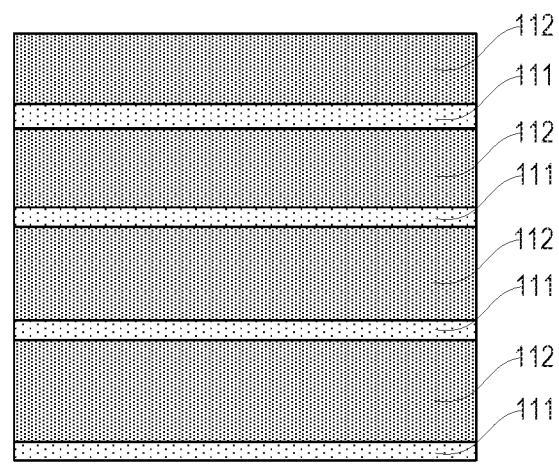
FIG. 6 illustrates an exemplary enlarged view of region A in FIG. 5, according to embodiments of the present disclosure.
Figure 6:
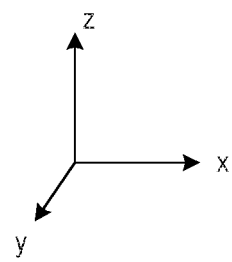

In some embodiments, in at least one portion of stack structure 11, the width of channel hole 14 decreases as the depth increases. The thicknesses of sacrificial layers 111 corresponding to the at least one portion decrease as the depth increases and the thicknesses of dielectric layers 112 corresponding to the at least one portion increase as the depth increases, as shown in FIGS. 5 and 6. In FIGS. 5 and 6, in at least region A, the variation of thicknesses of sacrificial layers 111 may correspond to the variation of the width of channel hole 14, and the variation of thicknesses of dielectric layers 112 may inversely correspond to the variation of the width of channel hole 14. For example, the width of channel hole 14 corresponding to region A may gradually decrease as the depth increases, the thicknesses of sacrificial layers 111 may gradually decrease as the depth increases, and the thicknesses of dielectric layers 112 may gradually increase as the depth increases. In some embodiments, the thickness of sacrificial layer 111 is nominally proportional to the width of channel hole 14 of the same depth. In some embodiments, the thickness of dielectric layer 112 is nominally inversely proportional to the width of channel hole 14 of the same depth. In some embodiments, channel hole 14 may be divided into a plurality of portions along the vertical direction. The thicknesses of sacrificial layers 111 in at least one of the portions may vary in the same trend described in region A. The thicknesses of dielectric layers 112 in at least one of the portions may vary inversely versus the trend described in region A. In some embodiments, the thicknesses of sacrificial layers 111 in each portion may vary in the same trend described in region A. In some embodiments, the thicknesses of dielectric layers 112 in each portion may vary inversely with the trend described in region A. In some embodiments, the width of the entire channel hole 14 may decrease as the depth increases. The thicknesses of all sacrificial layers 111 may decrease, e.g., gradually from top to bottom or layer by layer, as the depth increases in stack structure 11. The thicknesses of all dielectric layers 112 may increase, e.g., gradually from top to bottom or layer by layer, as the depth increases in stack structure 11.

In some embodiments, in at least one portion of stack structure 11, the width of channel hole 14 increases as the depth increases. The thicknesses of sacrificial layers 111 increases as the depth increases, and the thicknesses of dielectric layers 112 decreases as the depth increases. The variation of thicknesses of sacrificial layers 111 may correspond to the variation of the width of channel hole 14. The variation of thicknesses of dielectric layers 112 may inversely correspond to the variation of the width of channel hole 14. For example, the width of channel hole 14 may gradually increase as the depth increases. The thicknesses of sacrificial layers 111 may gradually increase as the depth increases, and the thicknesses of dielectric layers 112 may gradually decrease as the depth increases. In some embodiments, the thickness of sacrificial layer 111 is nominally proportional to the width of channel hole 14 of the same depth. In some embodiments, the thickness of dielectric layer 112 is nominally inversely proportional to the width of channel hole 14 of the same depth. In some embodiments, channel hole 14 may be divided into a plurality of portions along the vertical direction. The thicknesses of sacrificial layers 111 in at least one of the portions may vary in accordance with the trend described above. The thicknesses of dielectric layers 112 in at least one of the portions may vary in accordance with the trend described above. In some embodiments, the thicknesses of sacrificial layers 111 in each portion may vary in accordance with the trend described above. In some embodiments, the thicknesses of dielectric layers 112 in each portion may vary in accordance with the trend described above. In some embodiments, the width of the entire channel hole 14 may increase as the depth increases. The thicknesses of all sacrificial layers 111 increase, e.g., gradually from top to bottom or layer by layer, as the depth increases in stack structure 11. The thicknesses of all dielectric layers 112 decrease, e.g., gradually from top to bottom or layer by layer, as the depth increases in stack structure 11.

Figure 7:
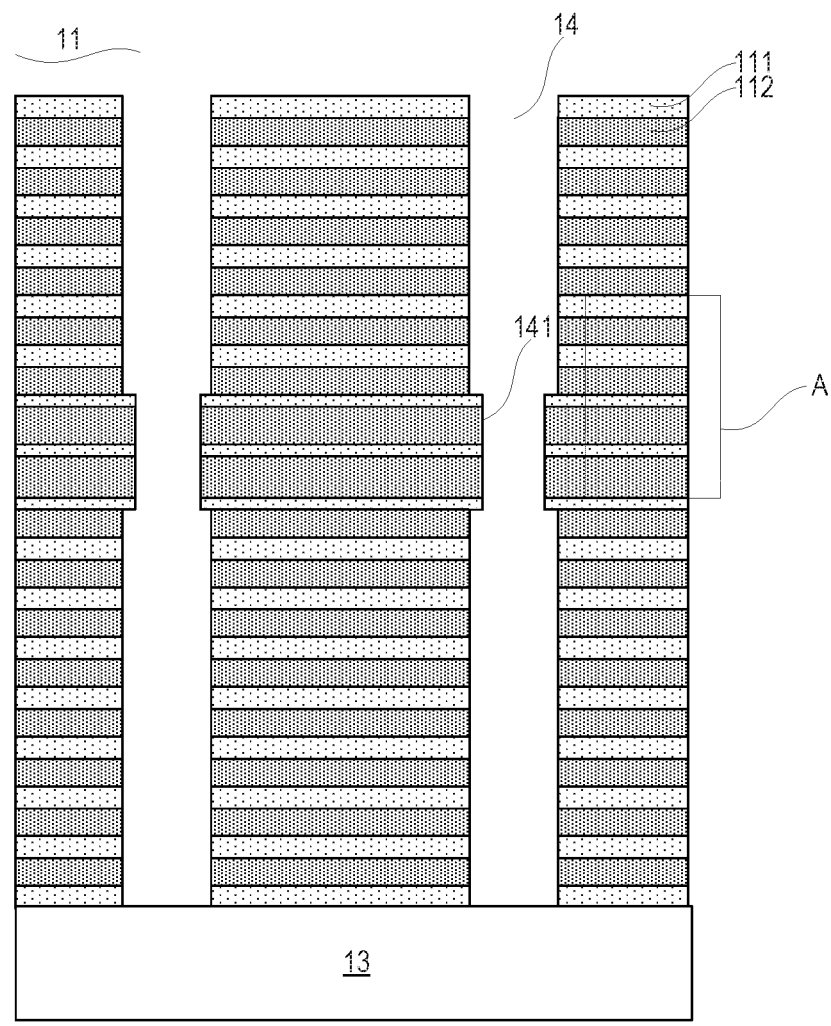
FIG. 7 illustrates a cross-sectional view of an exemplary 3D memory device, in which a channel hole includes a narrower portion, according to embodiments of the present disclosure.
Figure 8:
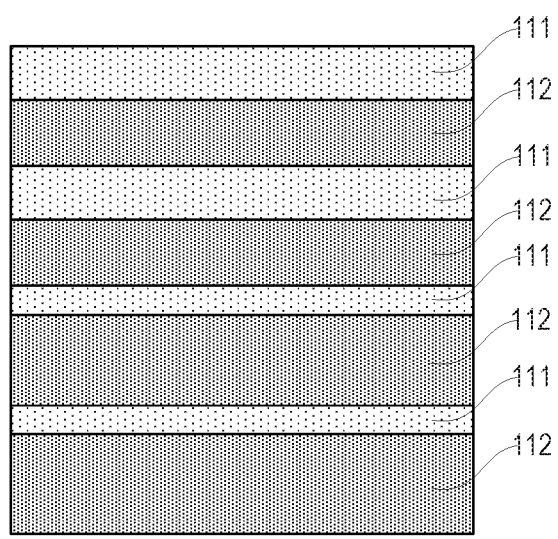
FIG. 8 illustrates an enlarged diagram of region A in FIG. 7, according to embodiments of the present disclosure.
Figure 8:
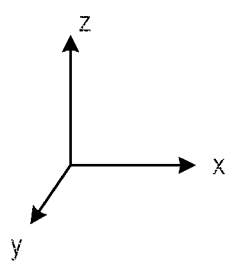

In some embodiments, as shown in FIG. 7, channel hole 14 includes one or more narrower portions 141. For ease of illustration, one narrower portion 141 is illustrated. In some embodiments, narrower portion 141 may be formed by protruding portions on the sidewalls of channel hole 14. The lateral distance between the sidewalls of narrower portion 141 may be less than the lateral distance between the sidewalls of channel hole 14 without the protruding portions, as shown in FIGS. 7 and 8. Narrower portion 141 may be at any suitable location between the top and bottom surfaces of channel hole 14 (or top and bottom surfaces of stack structure 11). In some embodiments, the width of narrower portion 141 is less than the width at any other location in channel hole 14. It should be noted that the number of the narrower portions 141 in channel hole 14 may be depending on the design and/or fabrication and should not be limited by the embodiments of the present disclosure. In some embodiments, the thicknesses of sacrificial layers 111 corresponding to narrower portion 141 is less than the thicknesses of other sacrificial layers 111 located in stack structure 11. In some embodiments, the thicknesses of dielectric layers 112 corresponding to narrower portion 141 is greater than the thicknesses of other dielectric layers 112 located in stack structure 11. That is, the thicknesses of sacrificial layers 111 at the same depth(s) of narrower portion 141 may be less than the thicknesses of other sacrificial layers 111 located in stack structure 11, and the thicknesses of dielectric layers 112 at the same depth(s) of narrower portion 141 may be greater than the thicknesses of other dielectric layers 112 located in stack structure 11.

Figure 9:
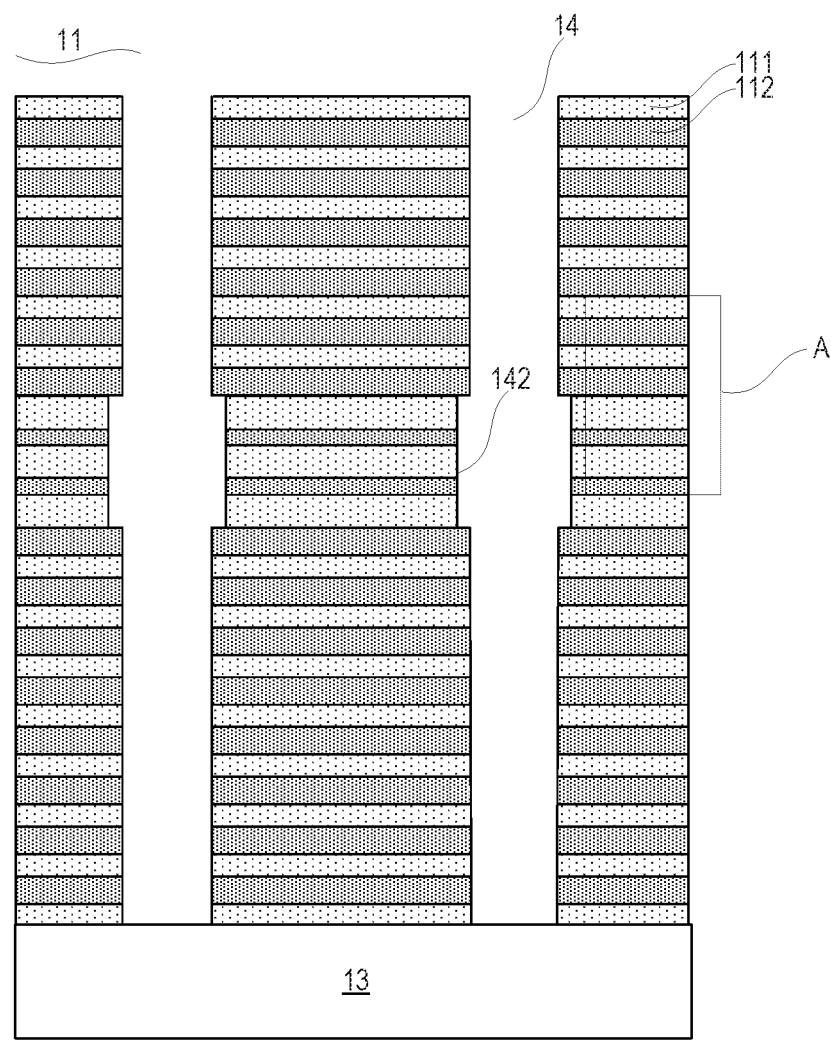
FIG. 9 illustrates a cross-sectional view of an exemplary 3D memory device, in which a channel hole includes a wider portion, according to embodiments of the present disclosure.
Figure 10:
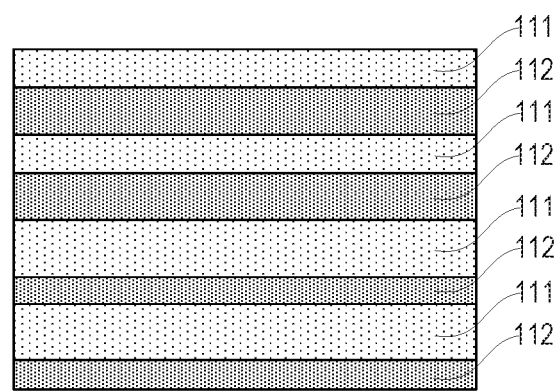
FIG. 10 illustrates an enlarged view of region A in FIG. 9, according to embodiments of the present disclosure.
Figure 10:
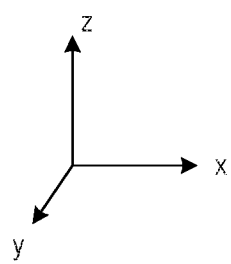

In some embodiments, as shown in FIG. 9, channel hole 14 includes one or more wider portions 142. For ease of illustration, one wider portion 142 is illustrated. In some embodiments, wider portion 142 may be formed by recessed portions on the sidewalls of channel hole 14. The lateral distance between the sidewalls of wider portion 142 may be greater than the lateral distance between the sidewalls of channel hole 14 without the recessed portions, as shown in FIGS. 9 and 10. Wider portion 142 may be at any suitable location between the top and bottom surfaces of channel hole 14 (or top and bottom surfaces of stack structure 11). In some embodiments, the width of wider portion 142 is greater than the width at any other location in channel hole 14. It should be noted that the number of the wider portions 142 in channel hole 14 may be depending on the design and/or fabrication and should not be limited by the embodiments of the present disclosure. In some embodiments, the thicknesses of sacrificial layers 111 corresponding to wider portion 142 is greater than the thicknesses of other sacrificial layers 111 located in stack structure 11. In some embodiments, the thicknesses of dielectric layers 112 corresponding to wider portion 142 is less than the thicknesses of other dielectric layers 112 located in stack structure 11. That is, the thicknesses of sacrificial layers 111 at the same depth(s) of wider portion 142 may be greater than the thicknesses of other sacrificial layers 111 located in stack structure 11, and the thicknesses of dielectric layers 112 at the same depth(s) of wider portion 142 may be less than the thicknesses of other dielectric layers 112 located in stack structure 11.

In the gate replacement process to form conductor layers in the 3D memory device, the thicknesses of sacrificial layers 111 may determine the thicknesses of the conductor layers, and the thicknesses of dielectric layers 112 may determine the thicknesses of the gate dielectric layers each between a pair of conductor layers (e.g., gate electrodes). The thicknesses of the sacrificial layers and dielectric layers may have an impact on the speed to program/erase memory cells and other parameters such as coupling effects. As previously described, in stack structure 11, the thicknesses of sacrificial layers 111 may be nominally proportional to the width of channel holes 14, and the thicknesses of dielectric layers 112 may be nominally inversely proportional to the width of channel holes 14. That is, along the vertical direction, a greater width of channel hole 14 may correspond to smaller thicknesses of dielectric layers 112 and greater thicknesses of sacrificial layers 111 at the same depth(s). A smaller width of channel hole 14 may correspond to greater thicknesses of dielectric layers 112 and smaller thicknesses of sacrificial layers 111 at the same depth(s). By applying the structures described above, impacts due to undesired width and poor topography of channel holes may be compensated. In the 3D memory device, the speed to program/erase memory cells can have improved uniformity, and the erasing state coupling effect can also be improved. The performance of memory cells can have improved uniformity. The threshold voltages of the memory cells can be distributed in a more desirable (e.g., smaller) range, and the performance stability of the 3D memory device can be improved. Meanwhile, the etching process to form the channel holes can be less restrictive, improving the process stability and process window. FIGS. 11-20 illustrate stack structure 12 of the 3D memory device after the gate replacement process, according to some embodiments. Stack structure 12 illustrated in FIGS. 11-20 may respectively be formed from stack structures 11 illustrated in FIGS. 1-10, by the gate replacement process. Different from stack structure 11, in FIGS. 11-20, sacrificial layers 111 may be replaced by conductor layers 121, which may include a suitable conductive material such as metal (e.g., tungsten, cobalt, etc.) and/or silicon. In some embodiment, conductor layers 121 include doped polycrystalline silicon. For example, in FIG. 14, conductor layers 121 and dielectric layers 112 in the lower portion of stack structure 12 may include a plurality of divisions 122, similar to divisions 113. A detailed description of the structures of channel hole 14 and thicknesses of conductor layers 121 and dielectric layers 112 in stack structures 12 may be referred to the description of stack structure 11 in FIGS. 1-10 and are not repeated herein.

Figure 21A:
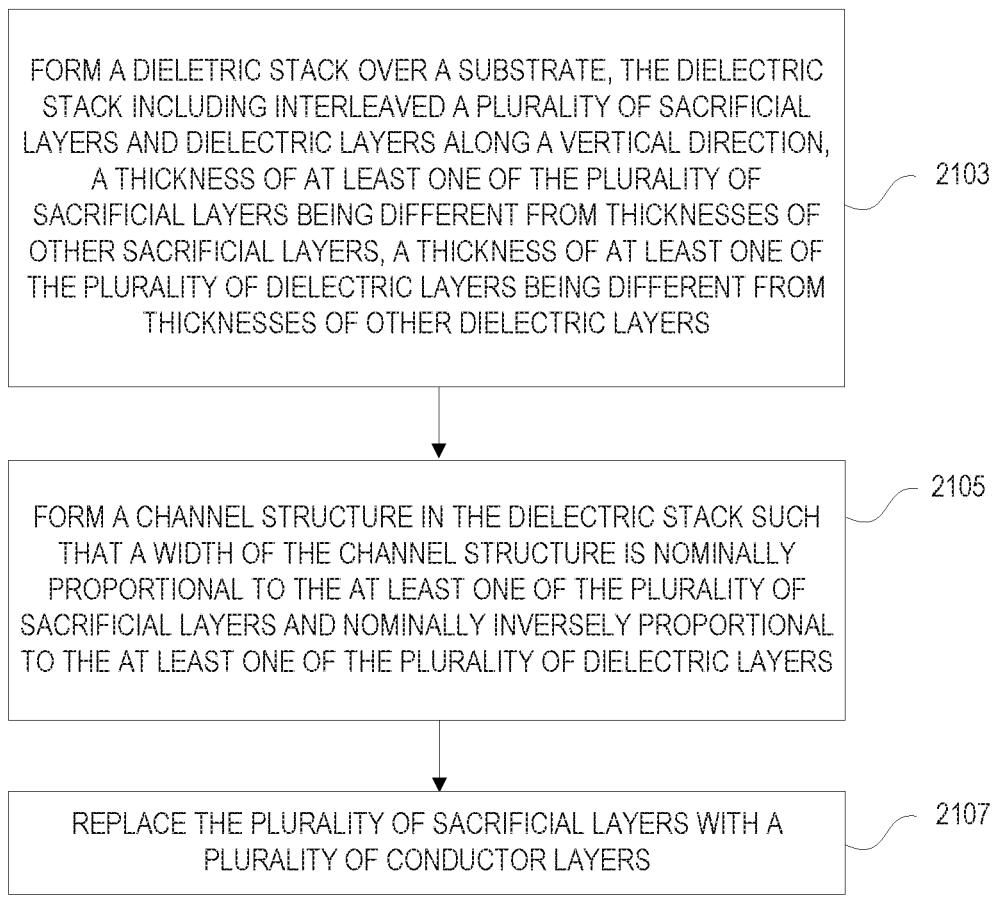
FIG. 21A illustrates a flowchart of an exemplary fabrication method for forming a 3D memory device, according to embodiments of the present disclosure.
Figure 21B:
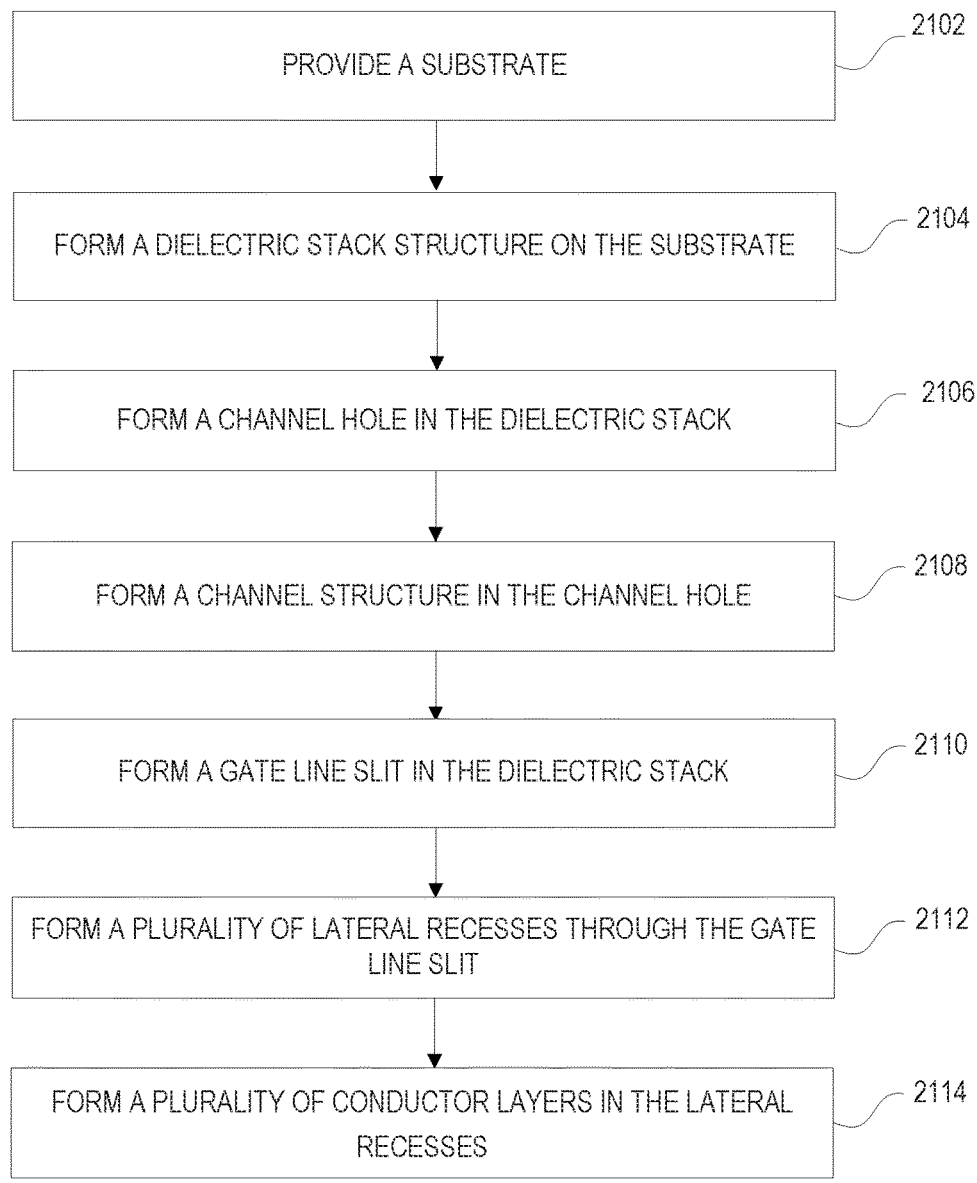
FIG. 21B illustrates a flowchart of a detailed exemplary fabrication method for forming a 3D memory device, according to embodiments of the present disclosure.

FIG. 21A illustrates a flowchart of an exemplary fabrication method 2101 for forming a stack structure 12, according to some embodiments. FIG. 21B illustrates a flowchart of a detailed fabrication method of method 2100, according to some embodiments. It is understood that the operations shown in methods 2100 and 2101 are not exhaustive and that other operations can be performed as well before, after, or between any of the illustrated operations. Further, some of the operations may be performed simultaneously, or in a different order than shown in FIGS. 21A and 21B.

Figure 22:
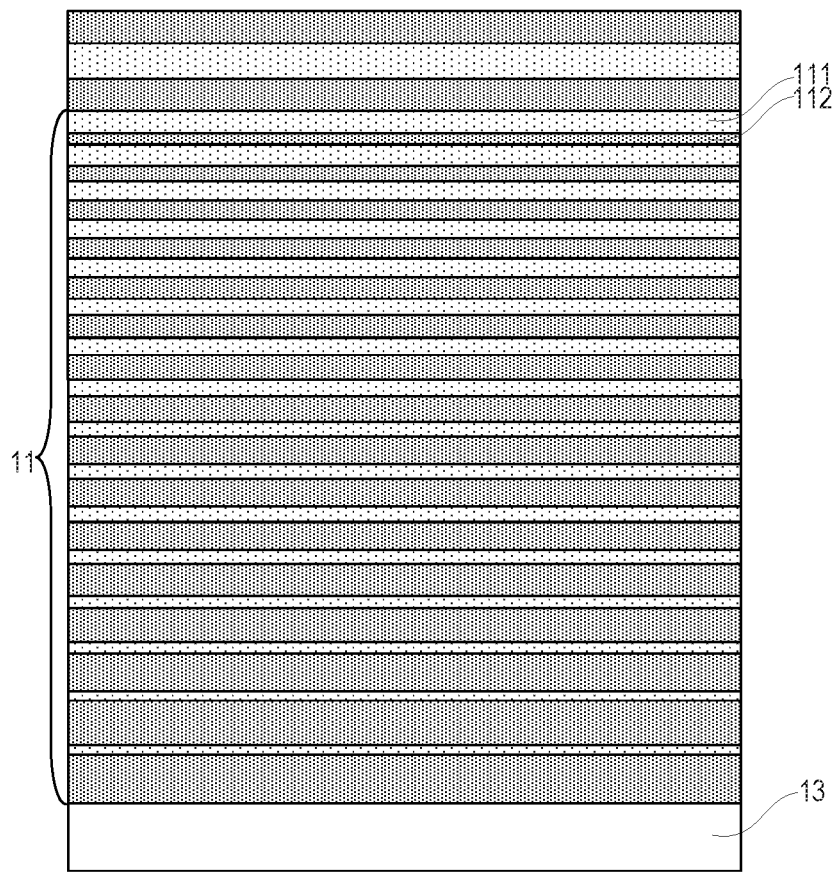
FIGS. 22-28 illustrate an exemplary fabrication method for forming a 3D memory device, according to embodiments of the present disclosure.
Figure 22:
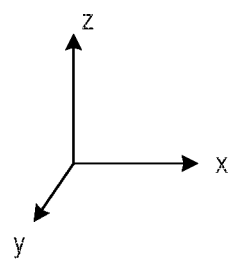

At the beginning of the process, a dielectric stack is formed over a substrate (Operation 2103). The dielectric layer includes interleaved a plurality of sacrificial layers and dielectric layers along the vertical direction. A thickness of at least one sacrificial layer is different from the thicknesses of other sacrificial layers, and a thickness of at least one dielectric layer is different from the thicknesses of other dielectric layers. FIG. 22 illustrates a corresponding structure.

As shown in FIG. 22, a substrate can first be provided (Operation 2102). A substrate 13 may include any suitable material such as a semiconductor material, e.g., silicon, germanium (Ge), silicon germanium (SiGe), silicon-on-insulator (SOI), and/or germanium-on-insulator (GOI). In some embodiments, substrate 13 includes a monocrystalline silicon wafer. In some embodiments, substrate 13 is an ion-doped substrate. For example, substrate 13 may be a P-type doped substrate or an N-type doped substrate.

A dielectric stack can be formed on the substrate (Operation 2104). As shown in FIG. 22, a stack structure 11 can be formed over substrate 13. As previously described, stack structure 11 may be a dielectric stack and include a plurality of sacrificial layers 111 and dielectric layers 112 arranged alternatingly along the vertical direction on substrate 13. Stack structure 11 may be formed by depositing sacrificial layers 111 and dielectric layers 112 repeatedly and alternatingly along the vertical direction using a suitable deposition method such as physical vapor deposition (PVD), chemical vapor deposition (CVD), and/or atomic layer deposition (ALD). In some embodiments, sacrificial layers 111 include silicon nitride and dielectric layers 112 include silicon oxide.

In some embodiments, the thickness of at least one sacrificial layer 111 is different from the thicknesses of other sacrificial layers 111. In some embodiments, the thickness of at least one dielectric layer 112 is different from the thicknesses of other dielectric layers 112. In some embodiments, the thicknesses of the at least one sacrificial layer 111 and the thicknesses of the at least one dielectric layer 112 may vary along the vertical direction in the trends described in FIGS. 1-20. For example, from the top to the bottom of stack structure 11, the thickness of sacrificial layers 111 may gradually decrease as the depth increases, and the thickness of dielectric layers 112 may gradually increase as the depth increases.

Referring back to FIG. 21A, after the formation of the dielectric stack, method 2101 proceeds to Operation 2105, in which a channel structure is formed in the dielectric stack such that a width of the channel structure is nominally proportional to the at least one sacrificial layer and is nominally inversely proportional to the at least one dielectric layer. FIGS. 23-26 illustrate the corresponding structures.

Figure 23:
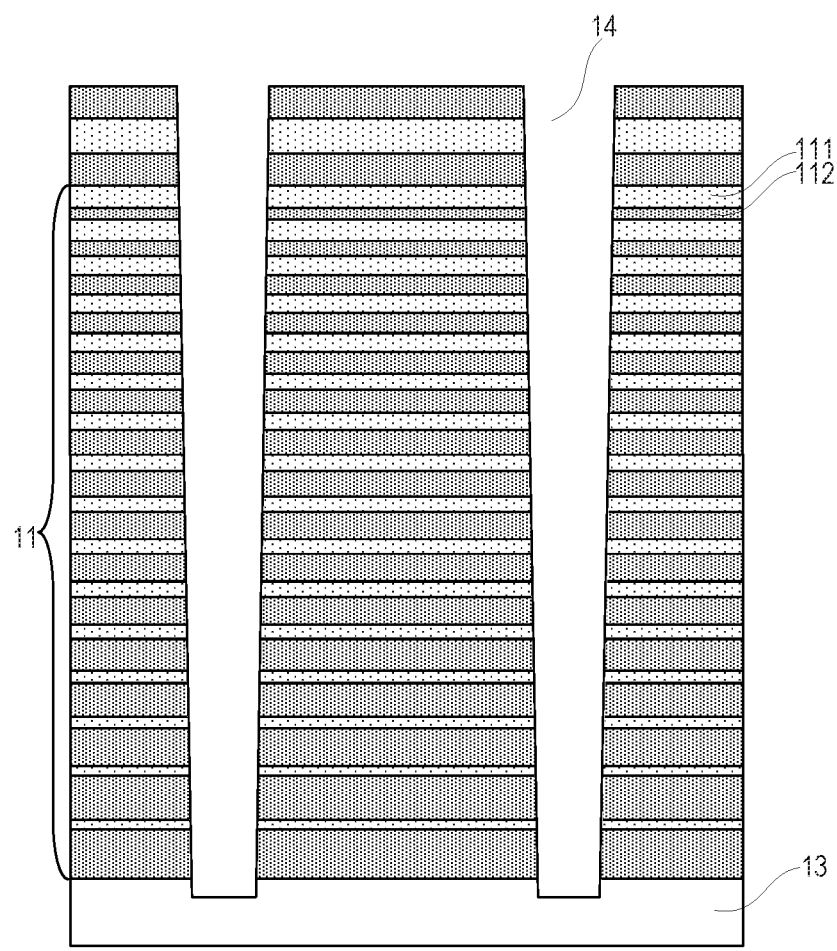
Figure 23:
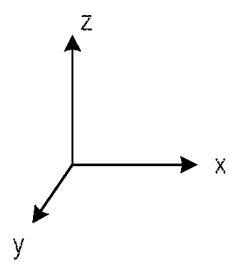

As shown in FIG. 23, a channel hole can be formed in the stack structure (Operation 2106). A channel hole 14 may be formed by any suitable patterning process. In some embodiments, a bottom of channel hole 14 may expose substrate 13. In some embodiments, a patterned mask layer (not shown) is formed on a top surface of stack structure 11. The patterned mask layer may include one or more openings that define the shape and position of channel holes 14. The patterned mask layer may include a patterned photoresist layer and/or any hard etching mask(s). A suitable etching process may be performed to remove portions of stack structure 11 based on the patterned mask layer, forming channel holes 14. Specifically, the etching process may include dry etch and/or wet etch. In some embodiments, stack structure 11 is etched using dry etch. In this example, the width of channel hole 14 decreases, e.g., gradually from top to bottom along the direction, as the depth increases.

Figure 11:
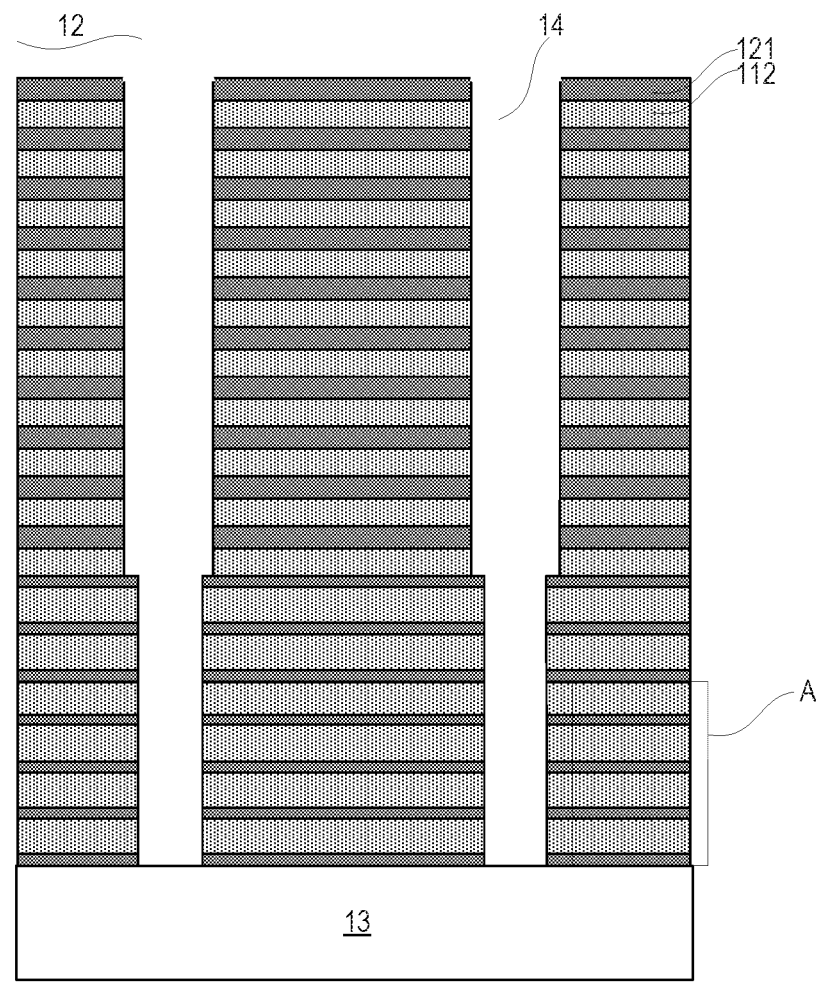
FIG. 11 illustrates a cross-sectional view of an exemplary 3D memory device, in which a width of a lower portion of a channel structure is less than a width of an upper portion of the channel structure, according to embodiments of the present disclosure.
Figure 12:
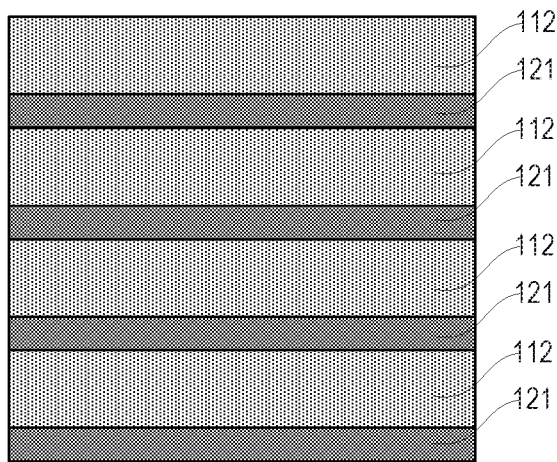
FIGS. 12-14 illustrate exemplary enlarged views of region A in FIG. 11, according to embodiments of the present disclosure.
Figure 12:
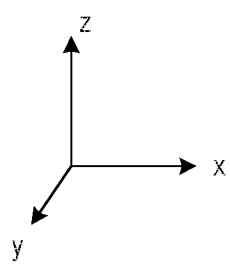
Figure 13:
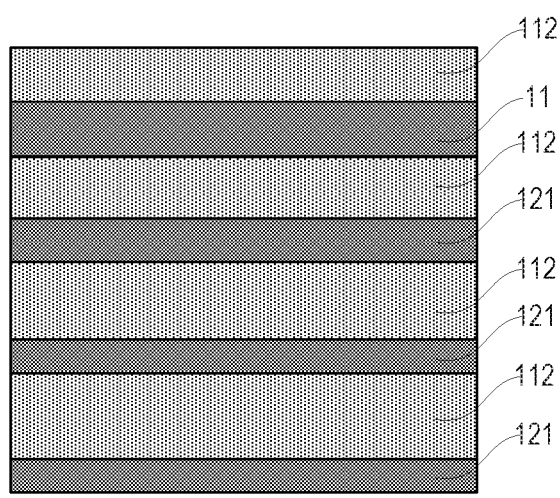
Figure 14:
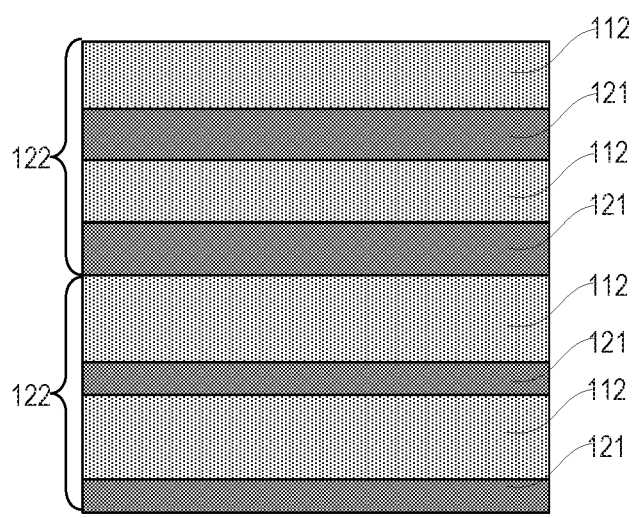
Figure 15:
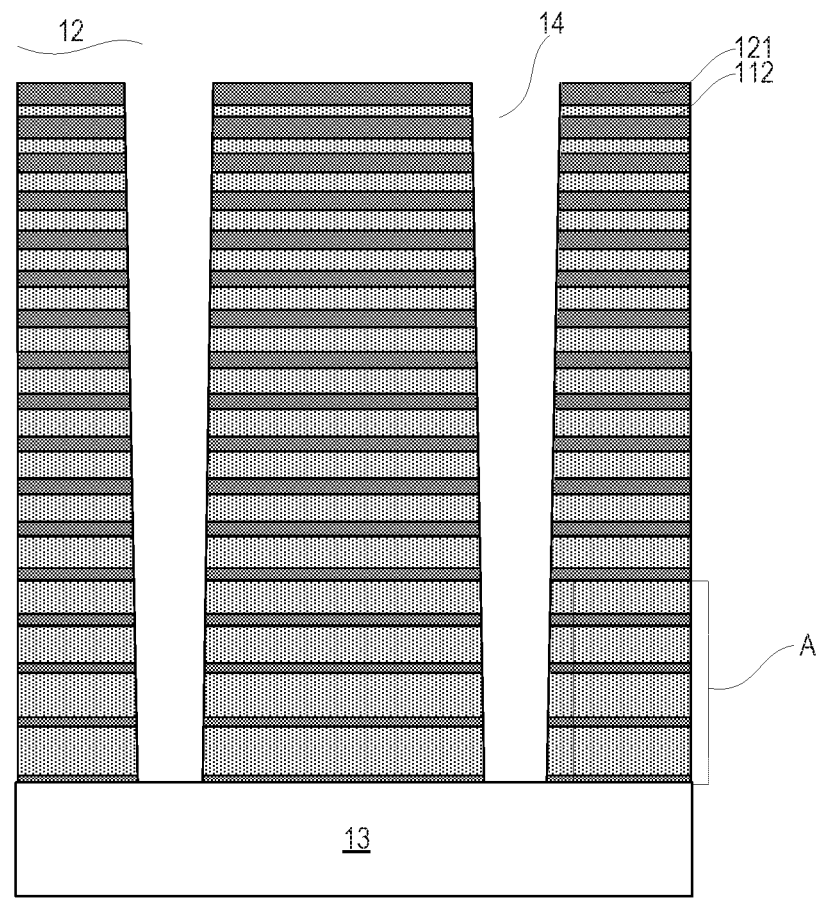
FIG. 15 illustrates a cross-sectional view of an exemplary 3D memory device, in which a width of a channel structure decreases as a depth of the channel structure increases, according to embodiments of the present disclosure.
Figure 15:
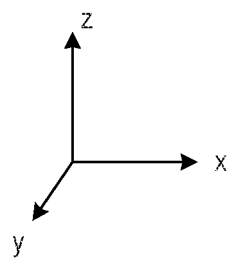
Figure 16:
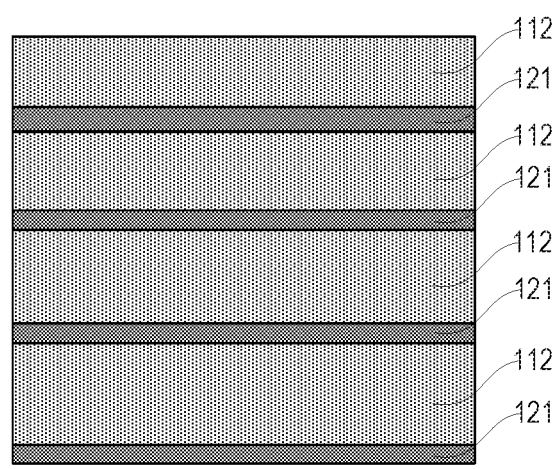
FIG. 16 illustrates an exemplary enlarged view of region A in FIG. 15, according to embodiments of the present disclosure.
Figure 17:
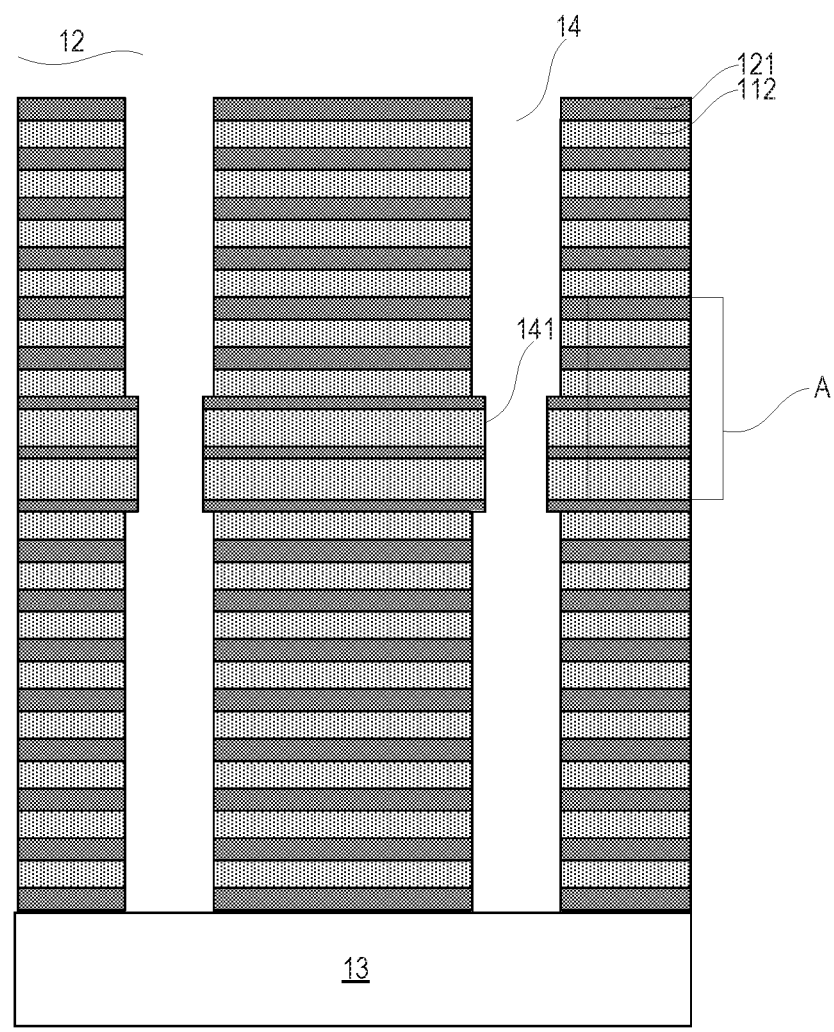
FIG. 17 illustrates a cross-sectional view of an exemplary 3D memory device, in which a channel structure includes a narrower portion, according to embodiments of the present disclosure.
Figure 17:
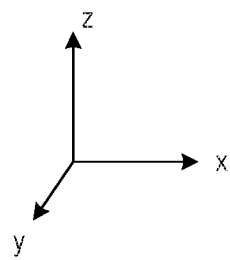
Figure 18:
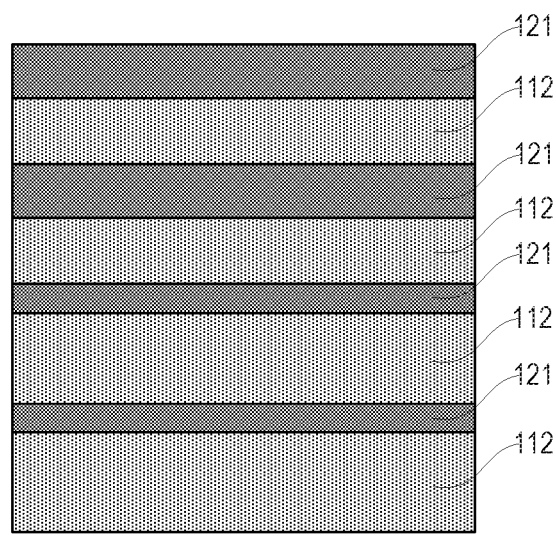
FIG. 18 illustrates an enlarged diagram of region A in FIG. 17, according to embodiments of the present disclosure.
Figure 19:
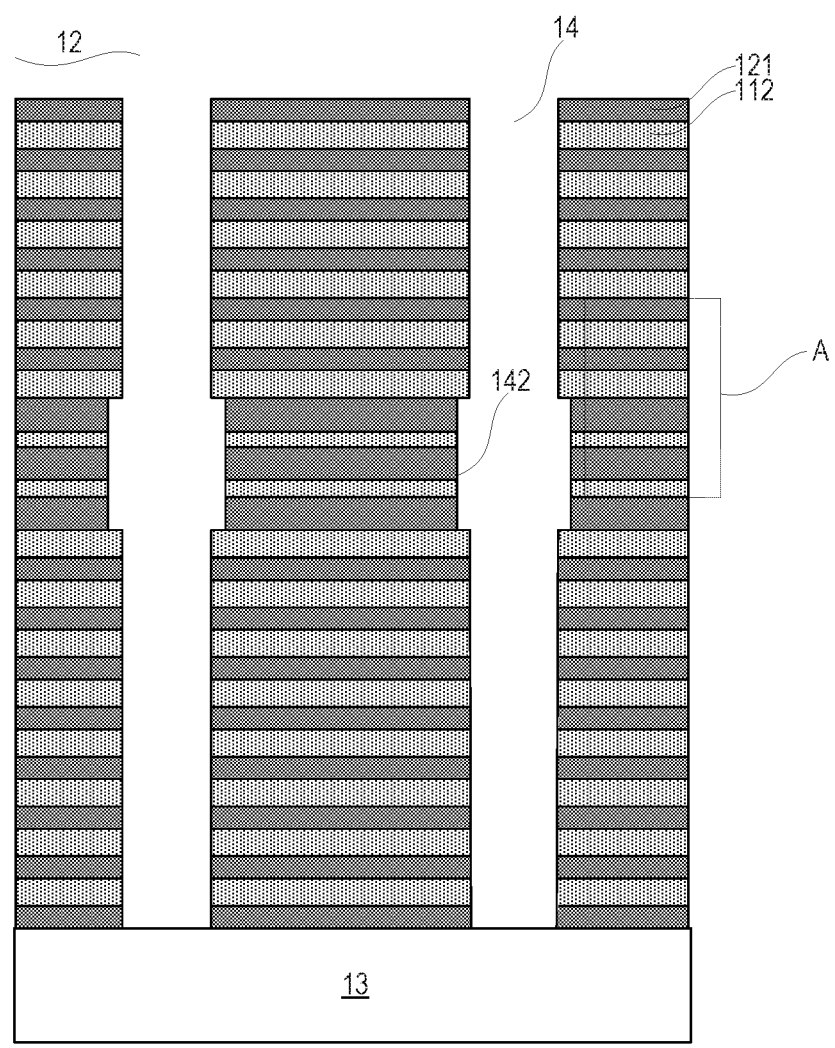
FIG. 19 illustrates a cross-sectional view of an exemplary 3D memory device, in which a channel structure includes a wider portion, according to embodiments of the present disclosure.
Figure 20:
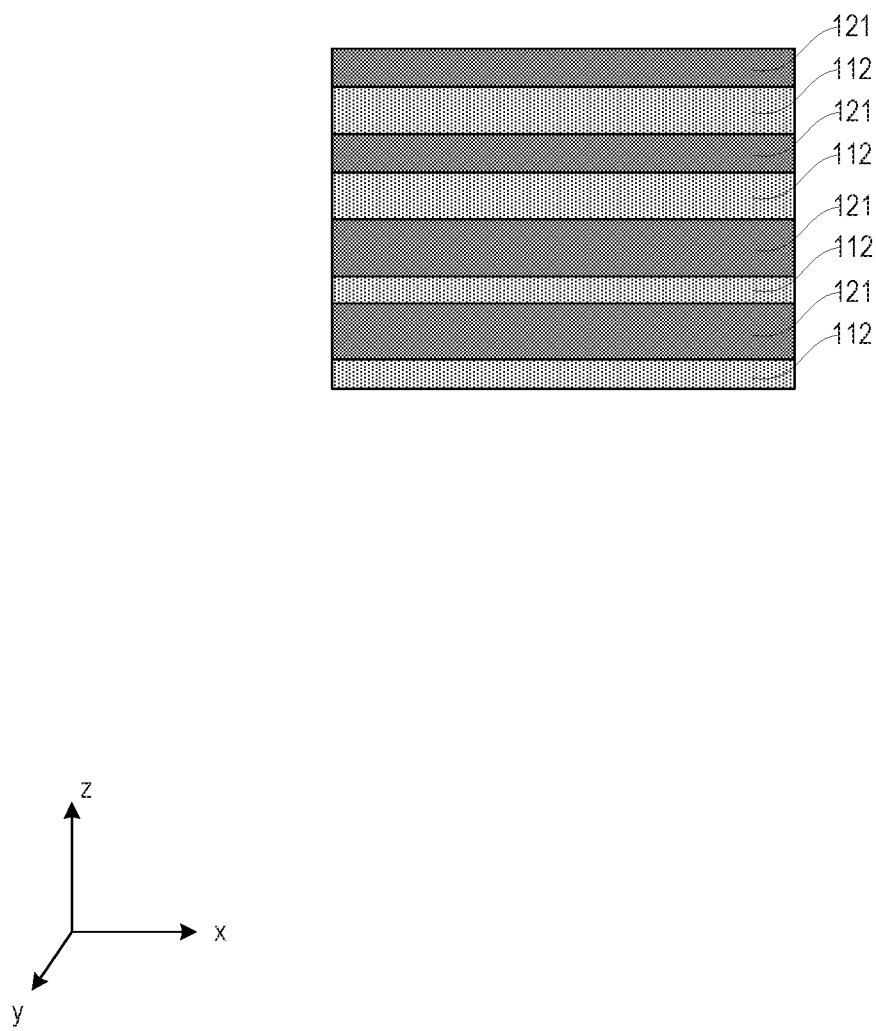
FIG. 20 illustrates an enlarged view of region A in FIG. 19, according to embodiments of the present disclosure.

In some embodiments, more than one patterned mask layers are used to form channel hole 14 with a lower portion and an upper portion (e.g., channel hole 14 shown in FIGS. 1 and 11). For example, a first patterned mask layer with a smaller opening may first be used to define the lateral dimensions of the lower portion, and a second patterned mask layer with a larger opening may be used to define the lateral dimensions of the upper portion. A suitable etching process may be performed after the formation of each patterned mask to form the lower and upper portions of channel hole 14. In some embodiments, the etching time of each etching is controlled such that the lower and upper portions of channel hole 14 may have desired lengths along the vertical direction. In some embodiments, any patterned mask layers may be removed after channel hole 14 is formed.

In some embodiments, to form channel hole 14 (e.g., channel hole 14 shown in FIGS. 7 and 9), the formation of the dielectric stack includes more than one deposition operations separated by one or more patterning/etching. For example, to form channel hole 14, the dielectric stack can be deposited incrementally, e.g., portion by portion. Each portion can be etched separately to form a respective portion of channel hole 14 before a subsequent portion of the dielectric stack is deposited. More than one patterned mask layers can be used in the formation of channel hole 14. In some embodiments, the patterned mask layers may have various dimensions to form channel hole 14 of the desired width along the vertical direction. In some embodiments, the etching time of each etching is controlled such that each portion of channel hole 14 may have desired lengths along the vertical direction. As examples of the dielectric stack, the narrower portion, the wider portion, and the portions above and below the narrower/wider portion, can be deposited separately. Each portion can be etched using a patterned mask layer of a desired dimension before the deposition of the portion above it. In some embodiments, any patterned mask layers are removed before the deposition of the dielectric stack and after the formation of the dielectric stack.

Figure 24:
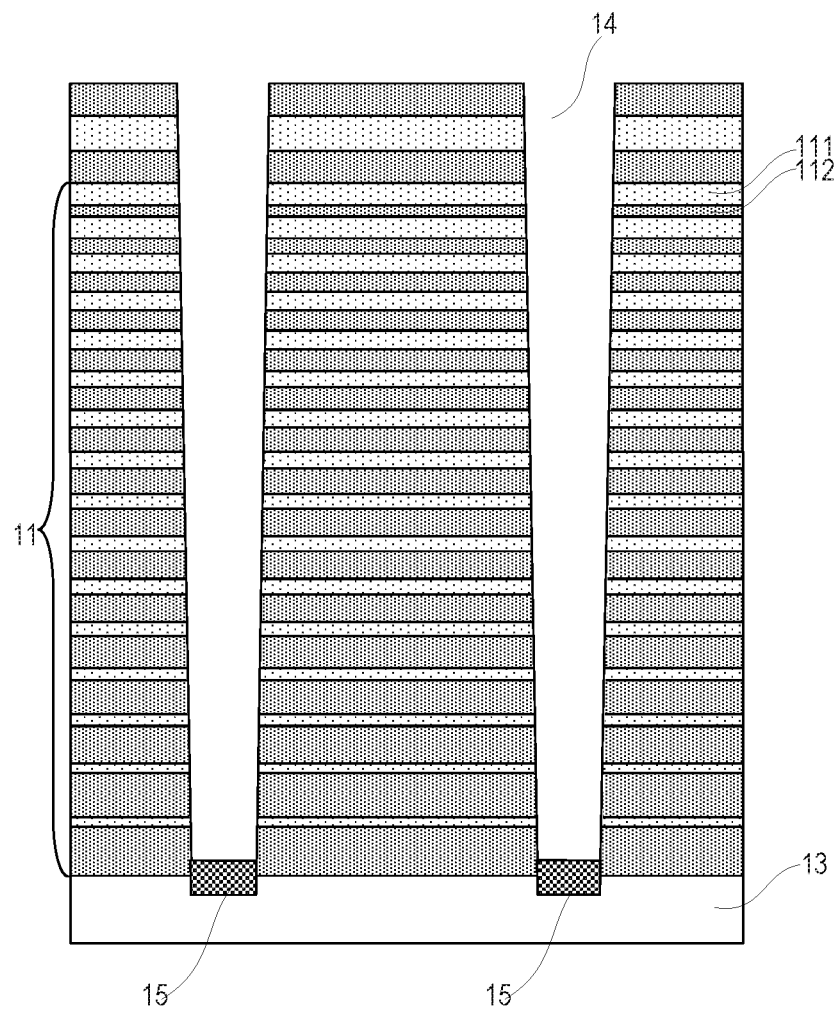

A channel structure may be formed in the channel hole (Operation 2108). As shown in FIG. 24, a semiconductor plug 15 may be formed at the bottom of channel hole 14. Semiconductor plug 15 may be in contact with substrate 13. In some embodiments, semiconductor plug 15 is formed by epitaxial growth and is referred to as an epitaxial layer. In some embodiments, semiconductor plug 15 is grown in situ at the bottom of channel hole 14 using selective epitaxial growth from substrate 13. In some embodiments, semiconductor plug 15 has the same lattice and material as substrate 13. In some embodiments, substrate 13 includes silicon, and semiconductor plug 15 includes epitaxial silicon. Semiconductor plug 15 may be used to form channel regions for the source line transistors.

Figure 25:
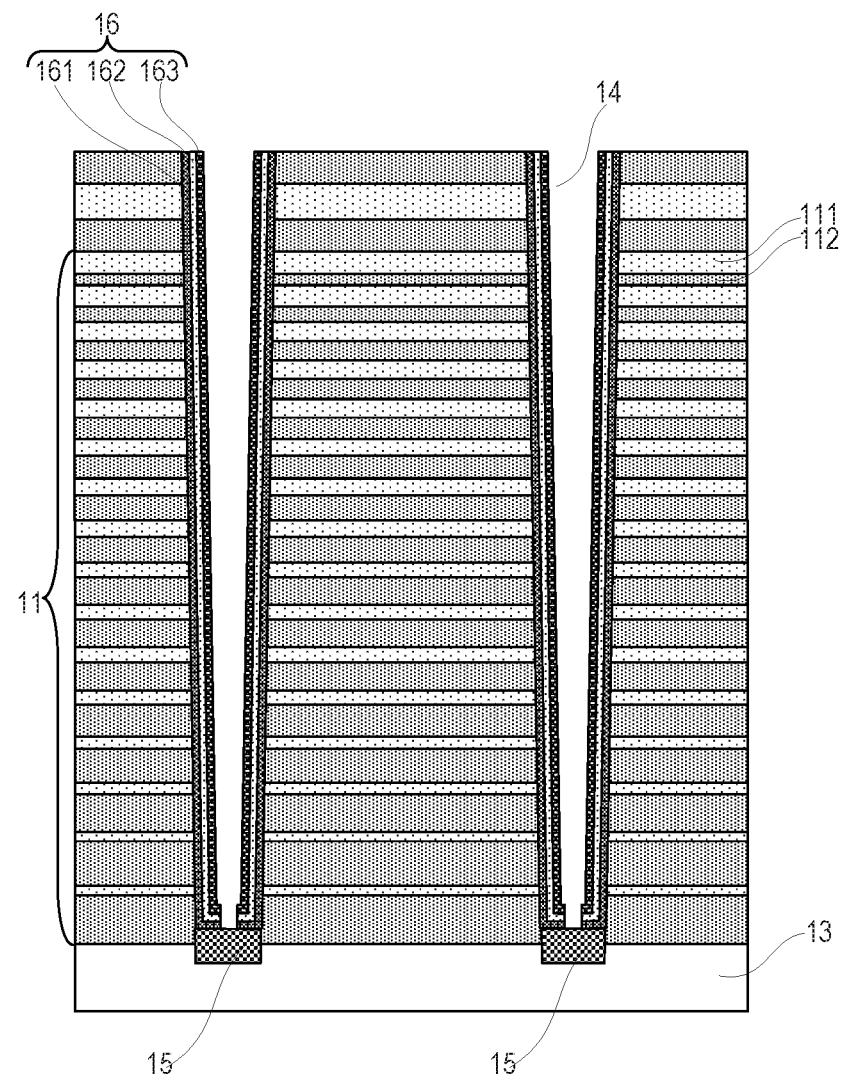
Figure 26:
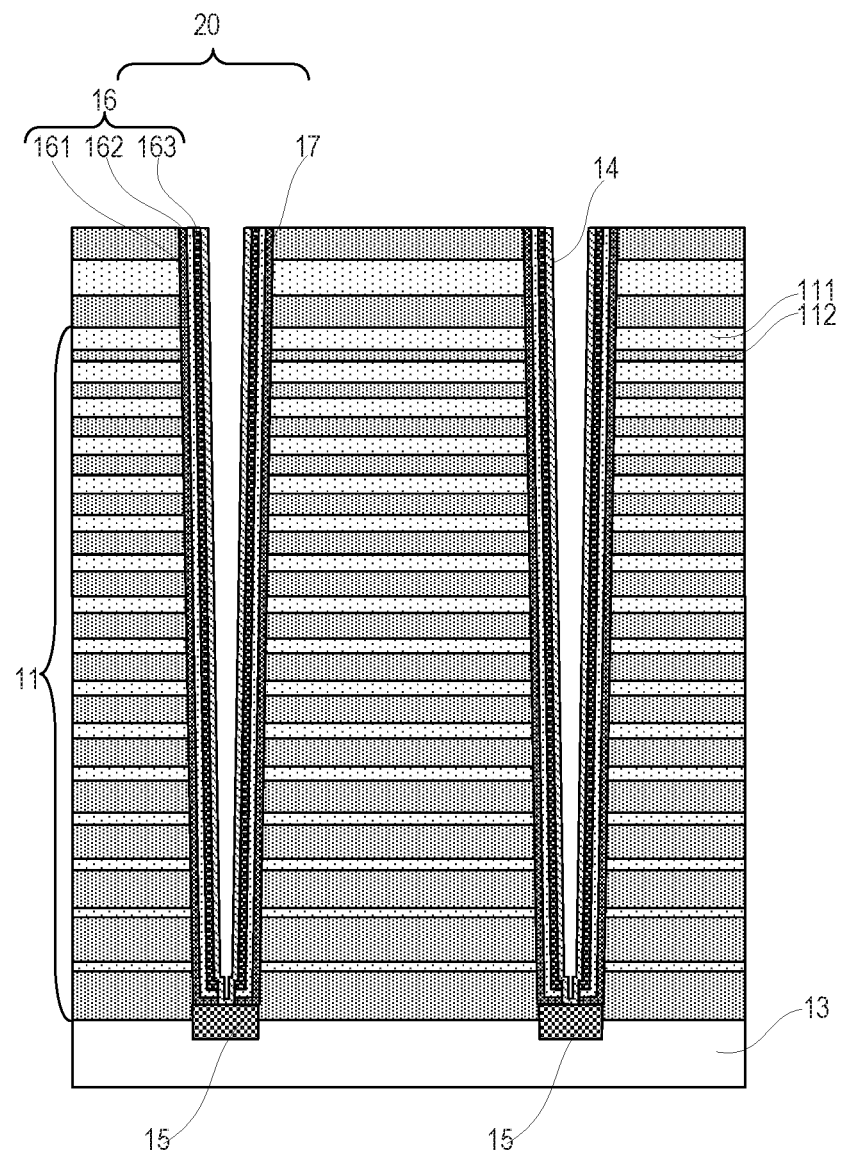

As shown in FIGS. 25 and 26, a functional sidewall 16 may be formed over the sidewall surface of channel hole 14, and a channel layer 17 may be formed on functional sidewalls 16 over, e.g., the top surface of, semiconductor plug 15.

FIG. 25 illustrates a cross-sectional view of functional sidewall 16 over the channel hole. In some embodiments, functional sidewall 16 is also referred to as a functional layer and includes a blocking layer 161, a charge trapping layer 162, and a tunneling layer 163. Specifically, blocking layer 161 may be formed on the sidewall surface of channel hole 14, charge trapping layer 162 may be formed over blocking layer 161, and tunneling layer 163 may be formed over charge trapping layer 162.

In some embodiments, blocking layer 161 includes, but not limited to, silicon oxide, hafnium oxide, etc. In some embodiments, charge trapping layer 162 includes, but not limited to, silicon oxide, hafnium oxide, etc. In some embodiments, tunneling layer 163 includes, but not limited to, silicon oxide, hafnium oxide, etc. In some embodiments, blocking layer 161, charge trapping layer 162, and tunneling layer 163 can each be formed using PVD, CVD, and/or ALD. In some embodiments, blocking layer 161 includes silicon oxide, charge trapping layer 162 includes silicon nitride, and tunneling layer 163 includes silicon oxynitride and/or silicon oxide. In some embodiments, blocking layer 161, charge trapping layer 162, and tunneling layer 163 are each formed by ALD. In some embodiments, method 2100 also includes a recess etching process that removes a portion of functional sidewall 16 to expose semiconductor plug 15, as shown in FIG. 25.

FIG. 26 illustrates a cross-sectional view of channel layer 17 over the surfaces of functional sidewall 16 and semiconductor plug 15. In some embodiments, channel layer 17 can be formed by PVD, CVD, and/or ALD. In some embodiments, channel layer 17 includes polycrystalline silicon and is formed by ALD. In some embodiments, channel layer 17 includes other semiconductor materials.

In some embodiments, method 2100 further includes filling channel hole 14 with a suitable dielectric material (not shown), e.g., a dielectric core. In some embodiments, the dielectric core is formed over channel layer 17, e.g., after channel layer 17 is formed. The dielectric core may be formed by PVD, CVD, and/or ALD. In some embodiments, the dielectric core includes silicon oxide and is formed ALD. In some embodiments, a channel structure 20 having a semiconductor plug 15, a functional sidewall 16, a channel layer 17, and a dielectric core, may be formed.

Figure 27:
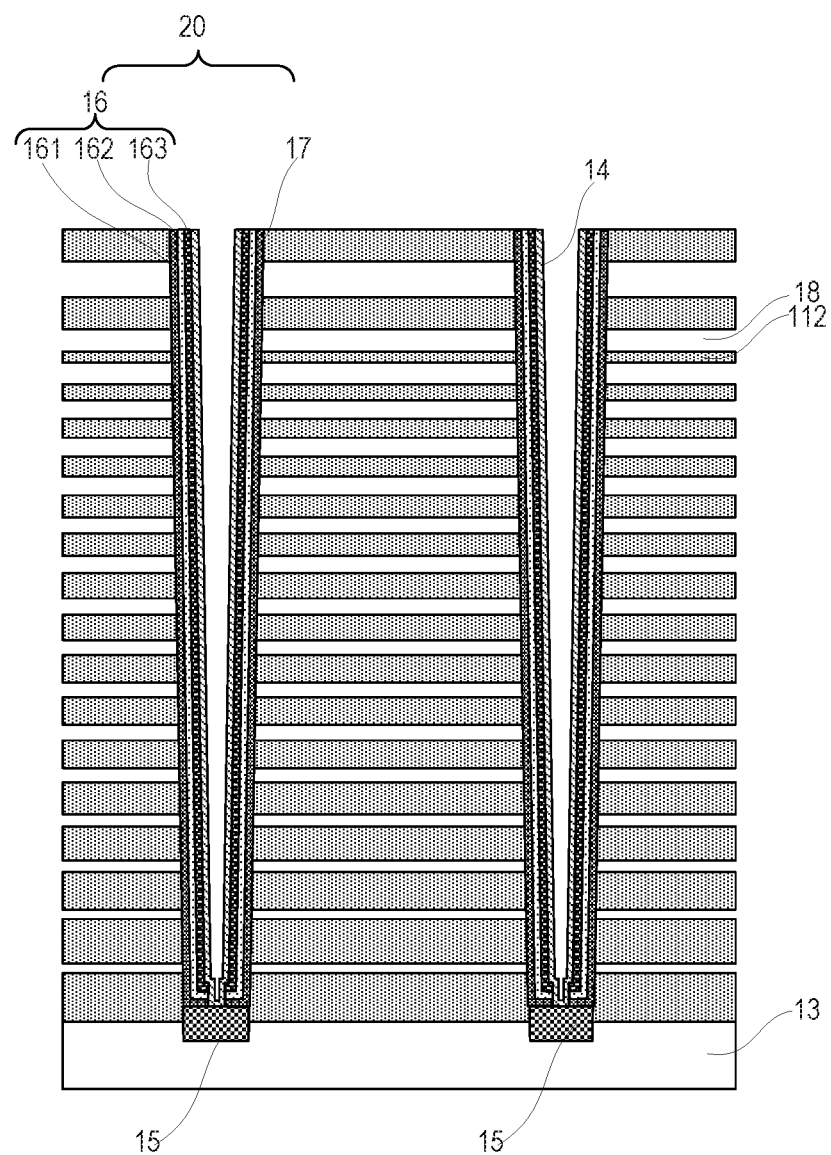

Referring back to FIG. 21A, after the formation of the channel structure, method 2101 proceeds to Operation 2107, in which the plurality of sacrificial layers may be replaced with a plurality of conductor layers. FIGS. 27 and 28 illustrate the corresponding structures.

A gate line slit (GLS, not shown) can be formed in the stack structure (Operation 2110). The gate line slit may extend vertically and laterally in stack structure 11, exposing (e.g., extending into) substrate 13. The location of the gate line slit may be determined based on the design and/or fabrication, and is not limited herein. The gate line slit (GLS) may also expose interleaved sacrificial layers 111 and dielectric layers 112 on the sidewalls. To form the gate line slit (GLS), a patterned mask layer (not shown) may be formed over stack structure 11. The patterned mask layer may include an opening that defines the shape and position of the gate line slit. A suitable etching process, e.g., dry etching and/or wet etching, can be performed to remove the portion on stack structure 11 exposed by the patterned mask layer, forming the gate line slit. In some embodiments, stack structure 11 is etched by a dry etching process to form the gate line slit. The patterned mask layer may then be removed.

A plurality of lateral recesses may be formed through the gate line slit (Operation 2112). As shown in FIG. 27, sacrificial layers 111 may be removed to form a plurality of lateral recesses 18. In some embodiments, sacrificial layers 111 are removed using a wet etching process. Specifically, sacrificial layers 111 may be removed by a wet etching solution that selectively etches sacrificial layers 111 over dielectric layers 112. That is, the etching rate of sacrificial layers 111 may be higher than the etching rate of dielectric layers 112, such that the etching of dielectric layers 112 can be negligible. Lateral recesses 18, interleaved with dielectric layers 112, may then be formed.

A plurality of conductor layers may be formed in the lateral recesses (Operation 2114). As shown in FIG. 28, a plurality of conductor layers 121 may be formed in lateral recesses 18. Conductor layers 121 may be formed by any suitable methods such as PVD, CVD, and/or ALD. In some embodiments, conductor layers 121 include tungsten and/or polysilicon, and are deposited using ALD. A stack structure 12 may be formed. In some embodiments, conductor layers 121 and channel structures 20 may form a plurality of memory cells, and stack structure 12 is also referred to as a memory stack.

In some embodiments, methods 2101 and 2100 further include filling the GLS with an insulating structure and a contact in the insulating structure. The insulating structure may include any suitable dielectric material such as silicon oxide, and the contact may include one or more of tungsten, polysilicon, cobalt, aluminum, and copper. The contact may be in contact and conductively connected to substrate 13. Optionally, a doping process may be performed to form a doped region in substrate 13 at the bottom of the GLS. The insulating structure may provide insulation between the contact and surrounding conductor layers 121. The insulating structure, the contact, and the doped region (if any), may function as a source contact structure of the 3D memory device. The insulating structure and the contact may each be formed by a suitable deposition method such as CVD, PVD, and/or ALD. The doping process may include ion implantation.

Embodiments of the present disclosure provide a memory device. The memory device includes a stack structure having interleaved a plurality of conductor layers and a plurality of dielectric layers over a substrate along a vertical direction. The memory device also includes a channel structure extending in the stack structure along the vertical direction. A thickness of at least one of the plurality of conductor layers is nominally proportional to a width of the channel structure at the same depth, and a thickness of at least one of the plurality of dielectric layers is nominally inversely proportional to a width of the channel structure at the same depth.

In some embodiments, the channel structure is divided into a lower portion and an upper portion along the vertical direction, a width of the channel structure in the lower portion being less than a width of the channel structure in the upper portion.

In some embodiments, the thicknesses of the conductor layers in the lower portion are less than the thicknesses of the conductor layers in the upper portion. In some embodiments, the thicknesses of the dielectric layers in the lower portion are greater than the thicknesses of the dielectric layers in the upper portion.

In some embodiments, the thickness of each of the conductor layers in the lower portion is the same. In some embodiments, the thickness of each of the conductor layers in the upper portion is the same.

In some embodiments, the thickness of each of the dielectric layers in the lower portion is the same. In some embodiments, the thickness of each of the dielectric layers in the upper portion is the same.

In some embodiments, the thicknesses of the conductor layers in the lower portion increase as the depth decreases.

In some embodiments, the thicknesses of the dielectric layers in the lower portion decrease as the depth decreases.

In some embodiments, in the lower portion, the conductor layers and the dielectric layers include at least one first division along the vertical direction, each first division including at least one conductor layer and at least one dielectric layer.

In some embodiments, in each of the at least one first division, the thickness of each conductor layer is the same. In some embodiments, the thicknesses of the conductor layers in the at least one first division increase as the depth decreases.

In some embodiments, in each of the at least one first division, the thickness of each dielectric layer is the same. In some embodiments, the thicknesses of the dielectric layers in the at least one first division decrease as the depth decreases.

In some embodiments, the thicknesses of the conductor layers in the upper portion decrease as the depth increases.

In some embodiments, the thicknesses of the dielectric layers in the upper portion increase as the depth increases.

In some embodiments, in the upper portion, the conductor layers and the dielectric layers include at least one second division along the vertical direction, each second division having at least one conductor layer and at least one dielectric layer.

In some embodiments, in each of the at least one second division, the thickness of each conductor layer is the same. In some embodiments, the thicknesses of the conductor layers in the at least one second division decrease as the depth increases.

In some embodiments, in each of the at least one second division, the thickness of each dielectric layer is the same. In some embodiments, the thicknesses of the dielectric layers in the at least one second division increase as the depth increases.

In some embodiments, the channel structure is divided into a lower portion and an upper portion along the vertical direction, a width of the channel structure in the upper portion being less than a width of the channel structure in the lower portion.

In some embodiments, the thicknesses of the conductor layers in the upper portion are less than the thicknesses of the conductor layers in the lower portion. In some embodiments, the thicknesses of the dielectric layers in the upper portion are greater than the thicknesses of the dielectric layers in the lower portion.

In some embodiments, the thickness of each of the conductor layers in the lower portion is the same. In some embodiments, the thickness of each of the conductor layers in the upper portion is the same.

In some embodiments, the thickness of each of the dielectric layers in the lower portion is the same. In some embodiments, the thickness of each of the dielectric layers in the upper portion is the same.

In some embodiments, the thicknesses of the conductor layers in the upper portion increase as the depth increases.

In some embodiments, the thicknesses of the dielectric layers in the upper portion decrease as the depth increases.

In some embodiments, in the upper portion, the conductor layers and the dielectric layers comprise at least one first division along the vertical direction, each first division having at least one conductor layer and at least one dielectric layer.

In some embodiments, in each of the at least one first division, the thickness of each conductor layer is the same. In some embodiments, the thicknesses of the conductor layers in the at least one first division increase as the depth increases.

In some embodiments, in each of the at least one first division, the thickness of each dielectric layer is the same. In some embodiments, the thicknesses of the dielectric layers in the at least one first division decrease as the depth increases.

In some embodiments, in the lower portion, the conductor layers and the dielectric layers include at least one second division along the vertical direction, each second division having at least one sacrificial layer and at least one dielectric layer.

In some embodiments, in each of the at least one second division, the thickness of each conductor layer is the same. In some embodiments, the thicknesses of the conductor layers in the at least one second division decrease as the depth decreases.

In some embodiments, in each of the at least one second division, the thickness of each dielectric layer is the same. In some embodiments, the thicknesses of the dielectric layers in the at least one second division increase as the depth decreases.

In some embodiments, the width of the channel structure decreases as the depth increases.

In some embodiments, the thicknesses of the conductor layers decrease as the depth increases.

In some embodiments, the thicknesses of the dielectric layers increase as the depth increases.

In some embodiments, the width of the channel structure increases as the depth increases.

In some embodiments, the thicknesses of the conductor layers increase as the depth increases.

In some embodiments, the thicknesses of the dielectric layers decrease as the depth increases.

In some embodiments, the channel structure includes a narrower portion between a top surface and a bottom surface of the stack structure, a width of the narrower portion being less than a width of the rest of the channel structure.

In some embodiments, the thicknesses of the conductor layers corresponding to the narrower portion are less than thicknesses of conductor layers corresponding to the rest of the channel structure. In some embodiments, the thicknesses of the dielectric layers corresponding to the narrower portion are greater than thicknesses of dielectric layers corresponding to the rest of the channel structure.

In some embodiments, the channel structure includes a wider portion between a top surface and a bottom surface of the stack structure, a width of the wider portion being greater than a width of the rest of the channel structure.

In some embodiments, the thicknesses of the conductor layers corresponding to the wider portion are greater than thicknesses of conductor layers corresponding to the rest of the channel structure. In some embodiments, the thicknesses of the dielectric layers corresponding to the wider portion are less than thicknesses of dielectric layers corresponding to the rest of the channel structure.

In some embodiments, the channel structure includes a semiconductor plug at a bottom of the channel structure, a blocking layer over a sidewall of the channel structure, a charge trapping layers over the blocking layer, a tunneling layer over the charge trapping layer, a semiconductor layer over the tunneling layer, and a dielectric core over the semiconductor layer.

Embodiments of the present disclosure provide a memory device. The memory device includes a stack structure having interleaved a plurality of conductor layers and a plurality of dielectric layers over a substrate along a vertical direction. The memory device also includes a channel structure extending in the stack structure and divided into a plurality of portions along the vertical direction. Thicknesses of conductor layers corresponding to each of the plurality of portions are nominally proportional to a width of the portion. Thicknesses of dielectric layers corresponding to each of the plurality of portions are nominally inversely proportional to a width of the channel structure in the respective portion.

In some embodiments, the channel structure is divided into a lower portion and an upper portion along the vertical direction, a width of the channel structure in the lower portion being less than a width of the channel structure in the upper portion.

In some embodiments, the thicknesses of the conductor layers in the lower portion are less than the thicknesses of the conductor layers in the upper portion. In some embodiments, the thicknesses of the dielectric layers in the lower portion are greater than the thicknesses of the dielectric layers in the upper portion.

In some embodiments, the thickness of each of the conductor layers in the lower portion is the same. In some embodiments, the thickness of each of the conductor layers in the upper portion is the same.

In some embodiments, the thickness of each of the dielectric layers in the lower portion is the same. In some embodiments, the thickness of each of the dielectric layers in the upper portion is the same.

In some embodiments, the channel structure is divided into a lower portion and an upper portion along the vertical direction, a width of the channel structure in the upper portion being less than a width of the channel structure in the lower portion.

In some embodiments, the thicknesses of the conductor layers in the upper portion are less than the thicknesses of the conductor layers in the lower portion. In some embodiments, the thicknesses of the dielectric layers in the upper portion are greater than the thicknesses of the dielectric layers in the lower portion.

In some embodiments, the thickness of each of the conductor layers in the lower portion is the same. In some embodiments, the thickness of each of the conductor layers in the upper portion is the same.

In some embodiments, the thickness of each of the dielectric layers in the lower portion is the same. In some embodiments, the thickness of each of the dielectric layers in the upper portion is the same.

In some embodiments, the channel structure includes a narrower portion between a top surface and a bottom surface of the stack structure, a width of the narrower portion being less than a width of the rest of the channel structure.

In some embodiments, the thicknesses of the conductor layers corresponding to the narrower portion are less than thicknesses of conductor layers corresponding to the rest of the channel structure. In some embodiments, the thicknesses of the dielectric layers corresponding to the narrower portion are greater than thicknesses of conductor layers corresponding to the rest of the channel structure.

In some embodiments, the channel structure includes a wider portion between a top surface and a bottom surface of the stack structure, a width of the wider portion being greater than a width of the rest of the channel structure.

In some embodiments, the thicknesses of the conductor layers corresponding to the wider portion are greater than thicknesses of conductor layers corresponding to the rest of the channel structure. In some embodiments, the thicknesses of the dielectric layers corresponding to the wider portion are less than thicknesses of dielectric layers corresponding to the rest of the channel structure.

In some embodiments, the channel structure includes a semiconductor plug at a bottom of the channel structure, a blocking layer over a sidewall of the channel structure, a charge trapping layers over the blocking layer, a tunneling layer over the charge trapping layer, a semiconductor layer over the tunneling layer, and a dielectric core over the semiconductor layer.

Embodiments of the present disclosure provide a method for forming a 3D memory device. The method includes the following operations. First, a dielectric stack is formed over a substrate. The dielectric stack includes interleaved a plurality of sacrificial layers and dielectric layers along a vertical direction. A thickness of at least one of the plurality of sacrificial layers is different from thicknesses of other sacrificial layers, and a thickness of at least one of the plurality of dielectric layers is different from thicknesses of other dielectric layers. A channel structure is formed in the dielectric stack such that a width of the channel structure is nominally proportional to the at least one of the plurality of sacrificial layers and inversely proportional to the at least one of the plurality of dielectric layers. The plurality of sacrificial layers are replaced with a plurality of conductor layers.

In some embodiments, the method further includes forming a gate line slit in the dielectric stack. Replacing the plurality of sacrificial layers with the plurality of conductor layers includes removing the plurality of sacrificial layers to form a plurality of lateral recesses, and depositing a conductor material to fill the plurality of lateral recesses.

In some embodiments, forming the channel structure includes forming a channel hole in the dielectric stack, forming a semiconductor plug at a bottom of the channel hole, and forming a functional sidewall over and in contact with the semiconductor plug.

In some embodiments, forming the functional sidewall includes forming a blocking layer over a sidewall of the channel hole, forming a charge trapping layer over the blocking layer, and forming a tunneling layer over the charge trapping layer.

In some embodiments, the method further includes forming a semiconductor layer over the tunneling layer and forming a dielectric core to fill the channel hole.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a stack structure comprising interleaved a plurality of conductor layers and a plurality of dielectric layers over a substrate along a vertical direction; and
a channel structure extending in the stack structure along the vertical direction and divided into a lower portion and an upper portion along the vertical direction, a width of the channel structure in the lower portion being less than a width of the channel structure in the upper portion,
wherein:
thicknesses of conductor layers in the lower portion are less than thicknesses of conductor layers in the upper portion,
thicknesses of dielectric layers in the lower portion are greater than thicknesses of dielectric layers in the upper portion,
a thickness of at least one of the plurality of conductor layers is nominally proportional to a width of the channel structure at a same depth, and
a thickness of at least one of the plurality of dielectric layers is nominally inversely proportional to a width of the channel structure at a same depth.

2. The memory device of claim 1, wherein:
the thickness of each of the conductor layers in the lower portion is the same; and
the thickness of each of the conductor layers in the upper portion is the same.

3. The memory device of claim 1, wherein:
the thickness of each of the dielectric layers in the lower portion is the same; and
the thickness of each of the dielectric layers in the upper portion is the same.

4. The memory device of claim 1, wherein:
the thicknesses of the conductor layers in the lower portion increase as the depth decreases; and
the thicknesses of the dielectric layers in the lower portion decrease as the depth decreases.

5. The memory device of claim 1, wherein:
in the lower portion, the conductor layers and the dielectric layers comprise at least one first division along the vertical direction, each first division comprising at least one conductor layer and at least one dielectric layer.

6. The memory device of claim 5, wherein:
in each of the at least one first division, the thickness of each conductor layer is the same, and the thickness of each dielectric layer is the same;
the thicknesses of the conductor layers in the at least one first division increase as the depth decreases; and
the thicknesses of the dielectric layers in the at least one first division decrease as the depth decreases.

7. The memory device of claim 1, wherein:
the thicknesses of the conductor layers in the upper portion decrease as the depth increases; and
the thicknesses of the dielectric layers in the upper portion increase as the depth increases.

8. The memory device of claim 1, wherein:
in the upper portion, the conductor layers and the dielectric layers comprise at least one second division along the vertical direction, each second division comprising at least one conductor layer and at least one dielectric layer.

9. The memory device of claim 8, wherein:
in each of the at least one second division, the thickness of each conductor layer is the same, and the thickness of each dielectric layer is the same;
the thicknesses of the conductor layers in the at least one second division decrease as the depth increases; and
the thicknesses of the dielectric layers in the at least one second division increase as the depth increases.

10. A memory device, comprising:
a stack structure comprising interleaved a plurality of conductor layers and a plurality of dielectric layers over a substrate along a vertical direction; and
a channel structure extending in the stack structure and divided into a plurality of portions along the vertical direction,
wherein:
the plurality of portions comprise a lower portion and an upper portion, a width of the channel structure in the lower portion being less than a width of the channel structure in the upper portion,
thicknesses of conductor layers in the lower portion are less than thicknesses of conductor layers in the upper portion,
thicknesses of dielectric layers in the lower portion are greater than thicknesses of dielectric layers in the upper portion,
thicknesses of conductor layers corresponding to each of the plurality of portions are nominally proportional to a width of the portion, and
thicknesses of dielectric layers corresponding to each of the plurality of portions are nominally inversely proportional to a width of the channel structure in the respective portion.

11. The memory device of claim 10, wherein:
the thickness of each of the conductor layers in the lower portion is the same; and
the thickness of each of the conductor layers in the upper portion is the same.

12. The memory device of claim 10, wherein:
the plurality of portions further comprise a narrower portion between a top surface and a bottom surface of the stack structure, a width of the narrower portion being less than a width of a remaining portion of the channel structure;
the thicknesses of the conductor layers corresponding to the narrower portion are less than thicknesses of conductor layers corresponding to the remaining portion of the channel structure; and the thicknesses of the dielectric layers corresponding to the narrower portion are greater than thicknesses of conductor layers corresponding to the remaining portion of the channel structure.

13. The memory device of claim 10, wherein:

the thickness of each of the dielectric layers in the lower portion is the same, and the thickness of each of the dielectric layers in the upper portion is the same.

14. The memory device of claim 10, wherein:

the thicknesses of the conductor layers in the lower portion increase as a depth decreases, and the thicknesses of the dielectric layers in the lower portion decrease as the depth decreases.

15. The memory device of claim 10, wherein:

in the lower portion, the conductor layers and the dielectric layers comprise at least one first division along the vertical direction, each first division comprising at least one conductor layer and at least one dielectric layer, and in each of the at least one first division, the thickness of each conductor layer is the same, and the thickness of each dielectric layer is the same.

16. The memory device of claim 10, wherein:

in the upper portion, the conductor layers and the dielectric layers comprise at least one second division along the vertical direction, each second division comprising at least one conductor layer and at least one dielectric layer, and in each of the at least one second division, the thickness of each conductor layer is the same, and the thickness of each dielectric layer is the same.

17. A memory device, comprising:

a stack structure comprising interleaved a plurality of conductor layers and a plurality of dielectric layers along a vertical direction; and a channel structure extending in the stack structure along the vertical direction, wherein:

the channel structure comprises a deformed portion between a top surface and a bottom surface of the stack structure, a width of the deformed portion being different from a width of a remaining portion of the channel structure, thicknesses of the conductor layers corresponding to the remaining portion are equal, and thicknesses of the conductor layers corresponding to the deformed portion are different from the thicknesses of the conductor layers corresponding to the remaining portion, and thicknesses of the dielectric layers corresponding to the remaining portion are equal, and thicknesses of the dielectric layers corresponding to the deformed portion are different from the thicknesses of the dielectric layers corresponding to the remaining portion.

18. The memory device of claim 17, wherein:

the deformed portion is a narrower portion, a width of the narrower portion being less than a width of the remaining portion of the channel structure, the thicknesses of the conductor layers corresponding to the narrower portion are less than the thicknesses of the conductor layers corresponding to the remaining portion, and the thicknesses of the dielectric layers corresponding to the narrower portion are greater than the thicknesses of the dielectric layers corresponding to the remaining portion.

19. The memory device of claim 17, wherein:

the deformed portion is a wider portion, a width of the wider portion being greater than a width of the remaining portion of the channel structure, the thicknesses of the conductor layers corresponding to the wider portion are greater than the thicknesses of the conductor layers corresponding to the remaining portion, and the thicknesses of the dielectric layers corresponding to the wider portion are less than the thicknesses of the dielectric layers corresponding to the remaining portion.

20. The memory device of claim 17, wherein:

the channel structure further comprises an upper portion above the deformed portion and a lower portion below the deformed portion.

* * * * *